United States Patent [19]
Horii et al.

[11] Patent Number: 5,841,632
[45] Date of Patent: Nov. 24, 1998

[54] ELECTRONIC PROCESSING SYSTEM

[75] Inventors: Yasuyuki Horii; Naohiro Yokoyama, both of Tokyo; Mitsuhiro Yoshida, Hanno, all of Japan

[73] Assignee: Kabushiki Kaisha Toshiba, Kawasaki, Japan

[21] Appl. No.: 829,644

[22] Filed: Mar. 31, 1997

[30] Foreign Application Priority Data

May 13, 1996 [JP] Japan ..................................... 8-117914

[51] Int. Cl.⁶ ............................... G06F 1/16; H05K 7/14
[52] U.S. Cl. ........................................... 361/686; 439/138
[58] Field of Search ..................................... 361/683–686, 361/724, 727; 312/223.1, 223.2; 439/138

[56] References Cited

U.S. PATENT DOCUMENTS

| | | |
|---|---|---|
| 5,290,178 | 3/1994 | Ma . |
| 5,331,506 | 7/1994 | Nakajima ................................ 361/686 |
| 5,408,384 | 4/1995 | Gannyo et al. ......................... 439/138 |
| 5,459,637 | 10/1995 | Ma et al. . |
| 5,535,093 | 7/1996 | Noguchi et al. ........................ 361/686 |
| 5,594,622 | 1/1997 | Hosoya et al. .......................... 361/686 |
| 5,684,673 | 11/1997 | Shibasaki et al. ....................... 361/686 |

*Primary Examiner*—Lynn D. Feild
*Attorney, Agent, or Firm*—Finnegan, Henderson, Farabow, Garrett & Dunner, L.L.P.

[57] ABSTRACT

A personal computer has a casing that includes a rear wall formed having an aperture, and a first expansion connector is located in the casing so as to face the aperture. A connector cover for opening and closing the aperture is swingably provided on the rear wall of the casing. An expansion adapter to which the computer is connected includes a carrying surface, on which the casing is detachably mounted, and a first relay connector located adjacent to the carrying surface and connectable with the first expansion connector. Provided on the carrying surface is a pushing projection that engages the connector cover, thereby causing it to swing to an open position, when the casing placed on the carrying surface is moved toward the first relay connector.

15 Claims, 21 Drawing Sheets

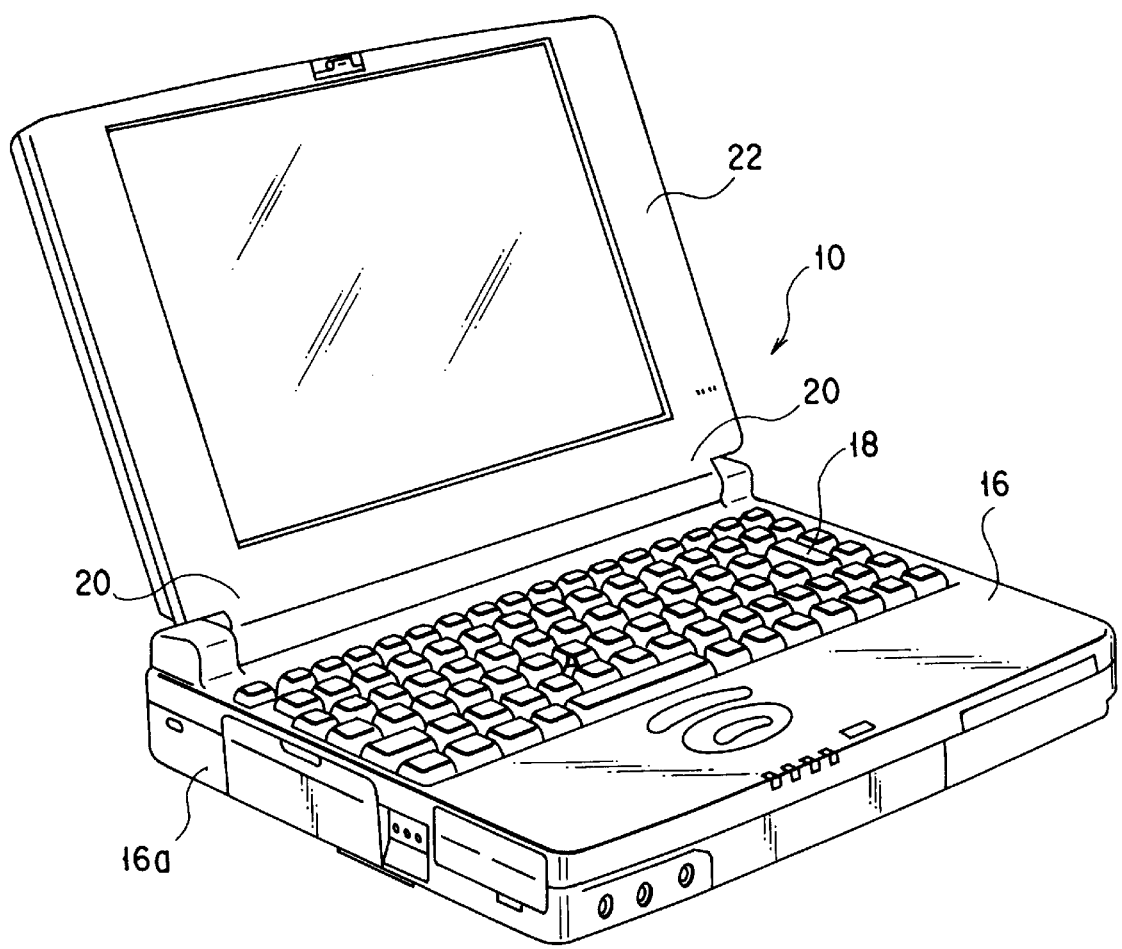
F I G. 3

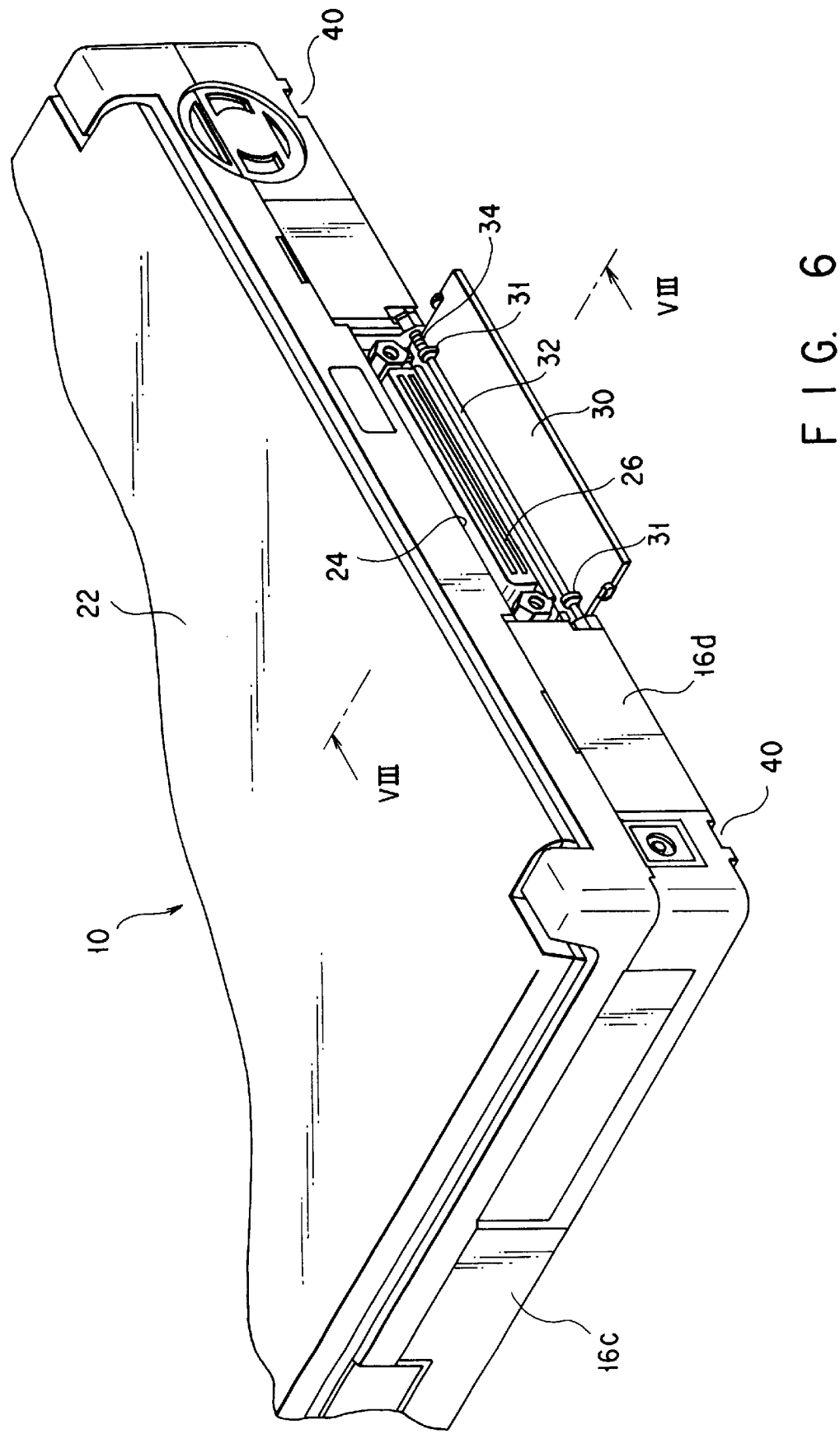
F I G. 6

ELECTRONIC PROCESSING SYSTEM

BACKGROUND OF THE INVENTION

The present invention relates to an electronic processing system provided with a portable electronic apparatus, such as a personal computer, and a connectable apparatus, such as an expansion apparatus, to which the electronic apparatus is connectable.

Recently, personal computers of the book- and notebook-types have become widespread due to advantages including handiness to carry and adaptability to free use of a built-in battery as a power supply unit that replaces the commercial power supply.

The computers of this type are designed for compactness that ensures improved portability, so that their functions for standard equipment are restricted more than those of stationary computers. Even if the equipment is satisfactory, addition of new functions or expansion of capability may be expected in some cases. To attain this, the rear face of the computer casing is provided with expansion connectors and ports that are connectable with apparatuses for expanded capability.

Generally, expansion connectors and ports are concealed under cover means for protection against dust and damage. This connector cover may be removably or swingably attached to the computer casing.

On the other hand, there are provided expansion apparatuses having card slots or the like that can be loaded with storage devices, such as a hard disk drive, optical disk drive, etc., and expanded-capability cards, as devices for expanding the capability of the portable personal computers. In general, one such expansion apparatus comprises a carrying section that can carry thereon at least the rear portion of a personal computer and an apparatus-side connector that adjoins the carrying section and is connectable with an expansion connector of the computer.

In connecting the personal computer to the expansion apparatus, the expansion connector is connected to the apparatus-side connector after manually removing or swinging the connector cover open. Thus, the computer and the expansion apparatus are connected electrically to each other, and the computer can be used with expanded capability or increased storage capacity.

In connecting the personal computer to the expansion apparatus in the electronic processing system constructed in this manner, however, the connector cover must be manually removed or swung on each occasion, thus making the connecting operation troublesome.

In some cases, moreover, the removed cover may be lost, or the connector may be damaged by a careless attempt at connecting it with the cover on.

BRIEF SUMMARY OF THE INVENTION

The present invention has been contrived in consideration of these circumstances, and its object is to provide an electronic processing system in which a portable electronic apparatus and a connectable apparatus can be connected securely and easily to each other.

In order to achieve the above object, an electronic processing system according to the present invention comprises an electronic apparatus and a connectable apparatus connectable with the electronic apparatus. The electronic apparatus has an apparatus casing including a bottom wall and a rear wall continuous with the bottom wall and formed having an aperture, a first connector located in the apparatus casing so as to face the aperture, and a connector cover rotatably provided on the rear wall of the apparatus casing, for opening and closing the aperture. The connectable apparatus includes a carrying section capable of detachably carrying thereon at least the rear portion of the casing of the electronic apparatus, a second connector located adjacent to the carrying section and connectable with the first connector of the electronic apparatus placed on the carrying section, and a pushing portion provided on the carrying section and adapted to engage the connector cover, thereby causing the cover to swing to an open position, when the apparatus casing placed on the carrying section is moved toward the second connector.

In connecting the electronic apparatus to the connectable apparatus, according to the electronic processing system constructed in this manner, the apparatus casing is placed on the carrying surface of the connectable apparatus and then moved toward the second connector. Thereupon, the pushing portion on the carrying section engages the connector cover of the apparatus casing, thereby causing the cover automatically to rotate to the open position. As a result, the first connector of the electronic apparatus is exposed through the aperture. Thereafter, the first connector is connected to the second connector of the connectable apparatus by further moving the apparatus casing.

In the electronic processing system according to the invention, the connector cover includes a rotating shaft, extending parallel to the bottom wall of the apparatus casing and situated adjacent to the bottom wall, and a push portion situated between the shaft and the bottom wall, and the pushing portion of the connectable apparatus includes a pushing projection provided on the carrying surface so as to be able to engage the push portion of the connector cover.

According to the electronic processing system constructed in this manner, the connector cover of the electronic apparatus can be automatically undone with use of a simple structure that includes only the pushing projection on the carrying surface of the connectable apparatus.

Another electronic processing system according to the invention comprises an electronic apparatus, an expansion adapter connectable with the electronic apparatus, and an expansion apparatus connectable with the expansion adapter.

The electronic apparatus has an apparatus casing including a bottom wall and a rear wall continuous with the bottom wall and formed having an aperture, a first expansion connector located in the apparatus casing so as to face the aperture, and a connector cover rotatably provided on the rear wall of the apparatus casing and used to open and close the aperture. The expansion adapter includes a body having a carrying surface capable of detachably carrying thereon the casing of the electronic apparatus, a connector setting surface provided with a first relay connector connectable with the first expansion connector, and a rear wall provided with a second relay connector connected to the first relay connector, and a pushing portion provided on the carrying surface and adapted to engage the connector cover, thereby causing the connector cover to rotate to an open position, when the apparatus casing placed on the carrying surface is moved toward the first relay connector.

The expansion apparatus includes a carrying surface capable of detachably carrying thereon the expansion adapter body and a second expansion connector located adjacent to the carrying surface and connectable with the second relay connector of the expansion adapter on the carrying surface.

In connecting the electronic apparatus to the expansion adapter, according to the electronic processing system constructed in this manner, the apparatus casing is placed on the carrying surface of the adapter and then moved toward the first relay connector. Thereupon, the pushing portion on the carrying surface engages the connector of the apparatus casing, thereby causing the cover automatically to rotate to the open position. As a result, the first expansion connector of the electronic apparatus is exposed through the aperture. Thereafter, the first expansion connector is connected to the first relay connector of the expansion adapter by further moving the apparatus casing.

Then, after the expansion adapter, connected with the electronic apparatus, is placed on the carrying surface of the expansion apparatus, the body of the adapter is moved toward the second expansion connector, and the second relay connector of the adapter is connected to the second expansion connector. Thus, the first expansion connector of the electronic apparatus is connected to the second expansion connector by means of the first and second relay connectors, whereby the electronic apparatus and the expansion apparatus are connected to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 21 show an electronic processing system according to an embodiment of the present invention, in which:

FIG. 1 is an exploded perspective view showing an outline of the electronic processing system;

FIG. 2 is a perspective view showing an expansion apparatus of the electronic processing system, along with an expansion adapter and a personal computer connected thereto;

FIG. 3 is a perspective view of the computer with its liquid crystal display unit open;

FIG. 4 is a perspective rear view of the computer with its display unit closed;

FIG. 5 is a perspective view showing the underside of the computer;

FIG. 6 is a perspective view showing a rear part of the computer with its connector cover undone;

FIG. 7 is a sectional view taken along line VII—VII of FIG. 4;

FIG. 8 is a sectional view taken along line VIII—VIII of FIG. 6;

FIG. 9 is a perspective view of the expansion adapter;

FIG. 10 is a sectional view showing a part of the computer together with a section along line X—X of FIG. 9;

FIG. 11 is a perspective view showing the underside of the expansion adapter;

FIG. 12 is a plan view of the expansion adapter with its slide plate in an initial position;

FIG. 13 is an enlarged exploded perspective view showing a locking-pushing unit of the expansion adapter and its surroundings;

FIG. 14 is a sectional view partially showing the expansion adapter and the computer with its rear portion in engagement with the locking-pushing unit;

FIG. 15 is a plan view of the expansion adapter with the slide plate in a recessed position;

FIG. 16 is a sectional view corresponding to FIG. 10, showing the computer with its connector cover off;

FIG. 17 is a sectional view corresponding to FIG. 10, showing the computer with its first expansion connector connected to a first relay connector of the expansion adapter;

FIG. 18 is a sectional view showing the locking-pushing unit and the rear portion of the computer with its first expansion connector connected to the first relay connector of the expansion adapter;

FIG. 19 is a cutaway side view of the electronic processing system showing a state immediately before the expansion adapter, carrying the computer thereon, is connected to the expansion apparatus;

FIG. 21 is a cutaway side view of the electronic processing system showing a state in which the expansion adapter, carrying the computer thereon, is connected to the expansion apparatus.

DETAILED DESCRIPTION OF THE INVENTION

An electronic processing system according to an embodiment of the present invention will now be described in detail with reference to the accompanying drawings.

Figure 1:
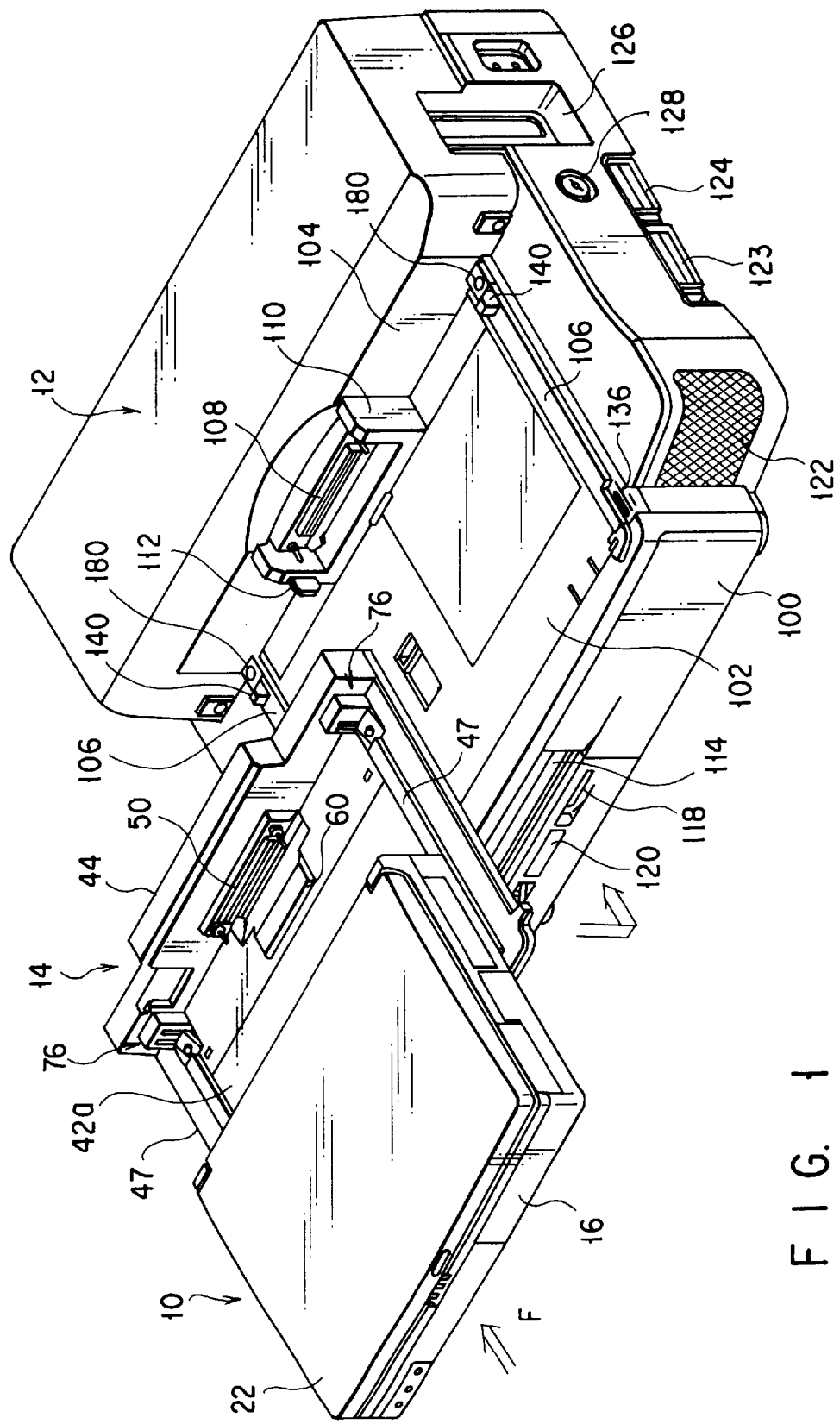
Figure 2:
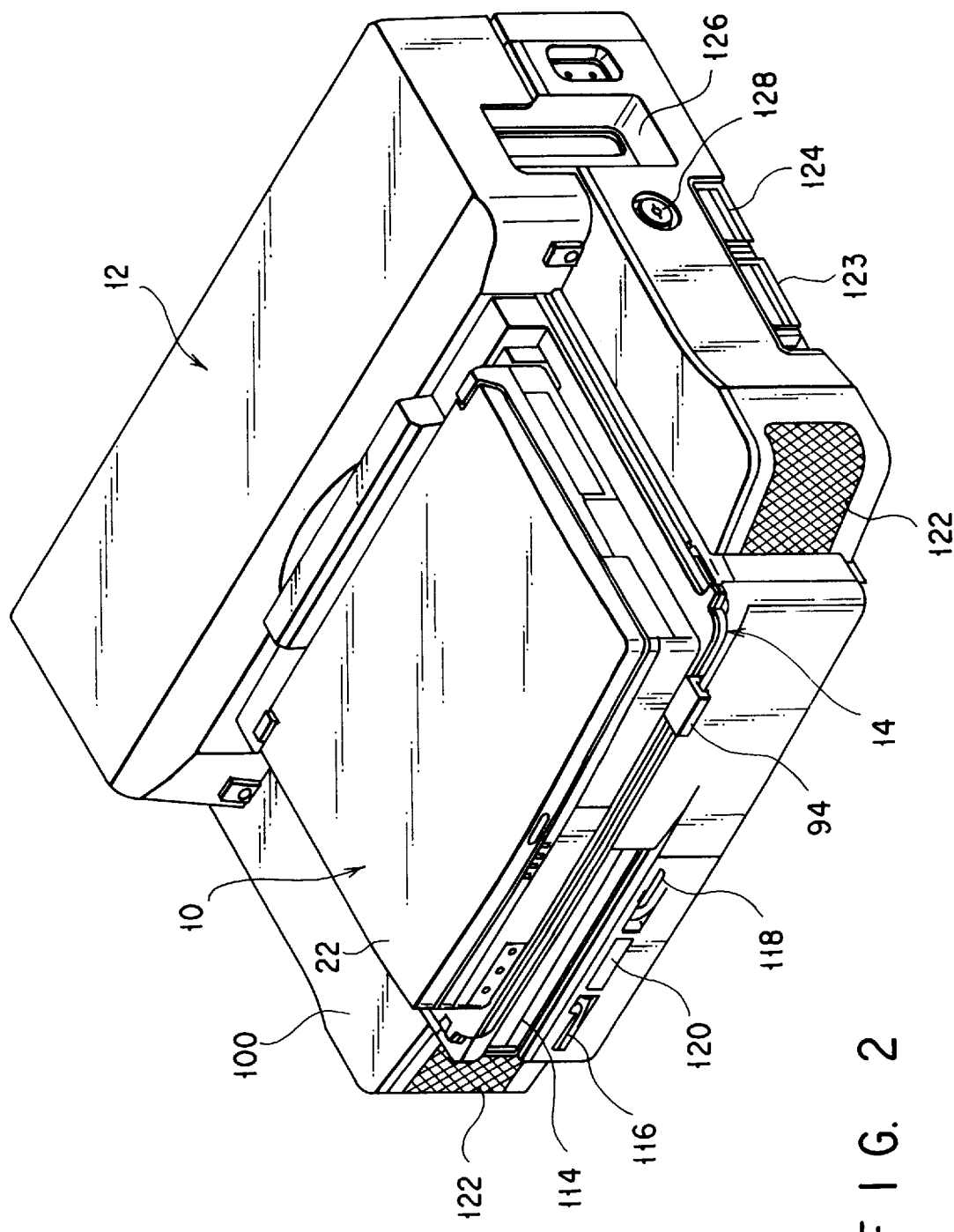

First, an outline of the electronic processing system will be described in brief. As shown in FIGS. 1 and 2, the electronic processing system comprises a sub-notebook type personal computer 10 as a portable electronic apparatus, an expansion apparatus 12 for expanding the function of the computer, and an expansion adapter 14 for adapting the computer 10 for the expansion apparatus 12. The expansion apparatus 12 is designed so as to be connected to an A4 notebook type personal computer when it is used. The personal computer 10, on the other hand, has a smaller size substantially equal to the size B5, so that the expansion adapter 14 is used to adapt the B5 computer 10 for the A4-service expansion apparatus 12.

In connecting the personal computer 10 to the expansion apparatus 12, the computer 10 is first connected to the expansion adapter 14, and the adapter 14 is then connected to the expansion apparatus 12. In this manner, the personal computer 10 can be connected to the expansion apparatus 12 by means of the expansion adapter 14.

Figure 4:
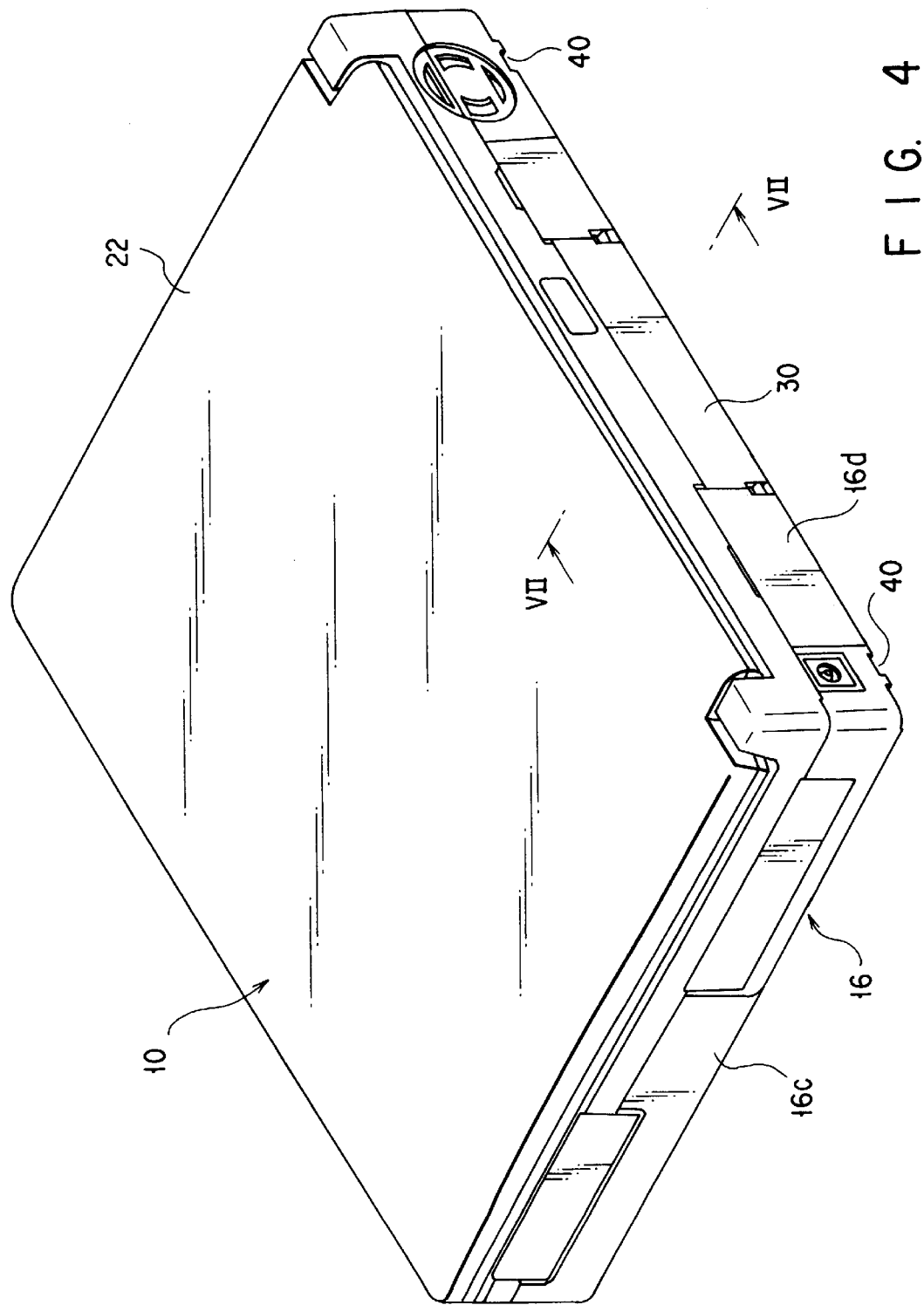
Figure 5:
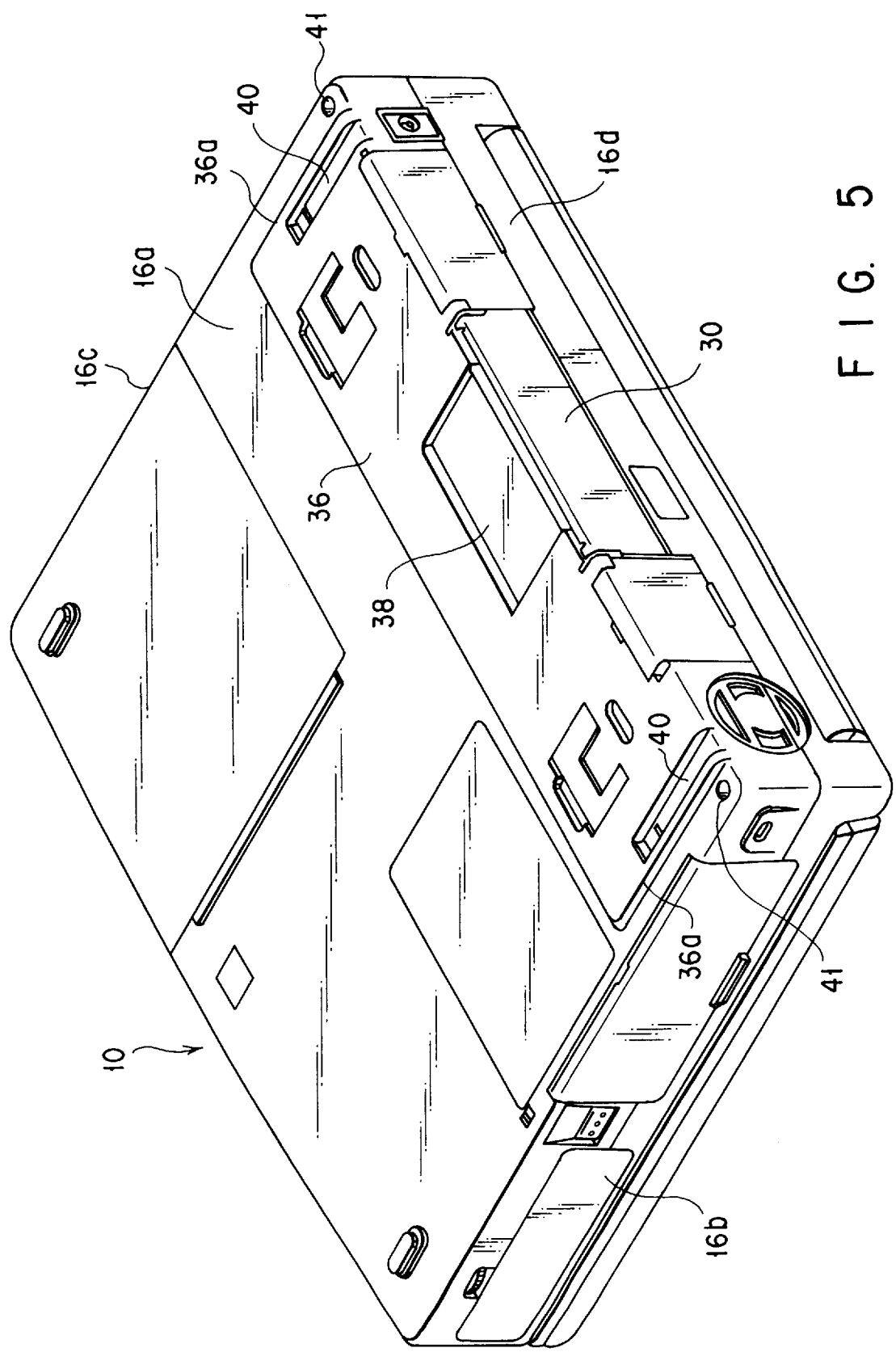

The following is a detailed description of the sub-notebook personal computer 10. As shown in FIGS. 3 to 5, the computer 10 has a computer casing 16 in the form of a flat rectangular box. The casing 16 includes a substantially rectangular bottom wall 16a, side walls 16b and 16c, and a rear wall 16d. The walls 16b, 16c and 16d are set up individually along the side edges of the bottom wall 16a.

A keyboard 18 for use as input means is provided on the top wall of the casing 16. Further, a rectangular display unit 22 is swingably mounted on the casing 16 by means of hinges 20 at the rear end portion of the top wall. The display unit 22 is swingable between an open position for input operation on the keyboard 18, as shown in FIG. 3, and a closed position in which the keyboard 18 is concealed by the display unit 22, as shown in FIG. 4.

In carrying the personal computer 10, the display unit 22 is swung down to the closed position so that the whole computer is in the form of a rectangular box that is handy to carry. The plane dimensions of the computer 10 are substantially equal to those of a B5 sheet.

As shown in FIGS. 4 to 8, a rectangular aperture 24 is formed substantially in the center of the rear wall 16d of the casing 16, extending in the transverse direction of the casing 16. In the casing 16, a first expansion connector 26 is disposed to oppose the aperture 24. The connector 26, which serves as a first connector, is fixed on a printed board 28 that extends parallel to the bottom wall 16a in the casing 16. The connector 26 can be connected to another connector through the aperture 24, and its connecting direction is substantially perpendicular to the extending direction of the rear wall 16d of the casing 16.

A connector cover 30 for opening and closing the aperture 24 is provided on the rear wall 16d of the casing 16. The cover 30 is a rectangular structure substantially equal to the aperture 24 in size. The cover 30 has a pair of bearing portions 31 protruding from its inner surface, and a rotating shaft 32 in the aperture 24 is passed through the bearing portions for rotation.

The shaft 32 extends parallel to the rear wall 16d of the casing 16 and in the transverse direction of the casing, and its opposite ends are fixed to the wall 16d. Also, the shaft 32 is located between the first expansion connector 26 and the bottom wall 16a of the casing 16.

Figure 7:
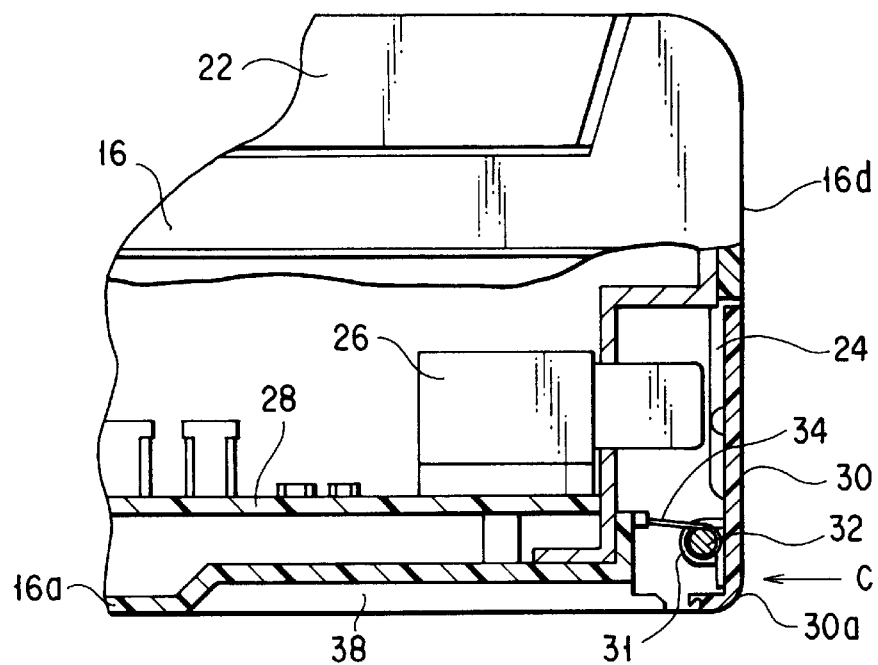
Figure 8:
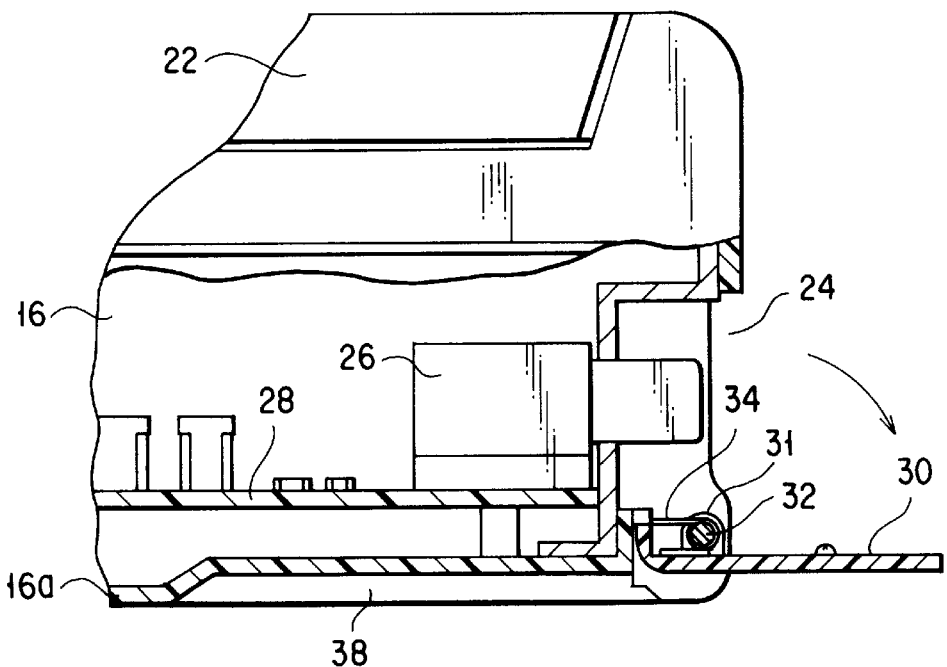

Thus, the connector cover 24 is swingable around the shaft 32 between a closed position, in which it closes the aperture 24, as shown in FIGS. 4 and 7, and an open position, in which it allows the aperture 24 to open so that the first expansion connector 26 is exposed, as shown in FIGS. 6 and 8. Further, the cover 30 is urged to be held in the closed position by a torsion spring 34 that is wound around the shaft 32.

The connector cover 30, constructed in this manner, is swung from the closed position toward the open position by pressing a push portion 30a between the shaft 32 and the lower end of the cover 30 at right angles to the rear wall 16d of the casing 16, as indicated by arrow C in FIG. 7.

As shown in FIG. 5, a flat, substantially rectangular guide projection 36 is formed on the rear portion of the bottom wall of the casing 16. The guide projection 36, which constitutes guide means and a part of first guide means, extends substantially across the width or transverse length of the casing 16, and is continuous with the rear wall 16d of the casing 16. The guide projection 36 functions as a guide for the attachment of the personal computer 10 to the expansion adapter 14, as mentioned later, and its width is substantially equal to the distance between guide rails of the adapter 14. Opposite side edges 36a of the projection 36 extend parallel to the side walls 16b and 16c of the casing 16, and serve as guide surfaces.

As shown in FIGS. 5, 6 and 7, a flat rectangular holding recess 38 is formed in the center of the guide projection 36. The recess 38 communicates with the lower end of the aperture 24 in the rear wall 16d of the casing 16, and extends for a given length from the aperture 24 in the direction perpendicular to the rear wall 16d.

As shown in FIG. 5, moreover, a pair of guide grooves 40 are formed individually on the opposite end portions of the guide projection 36 in the transverse direction thereof. The grooves 40 extend parallel to the side walls 16b and 16c from the rear wall 16d of the casing 16. Further, fitting holes 41 for use as positioning portions are formed individually in the opposite rear-end corner portions of the bottom wall 16a.

Figure 9:
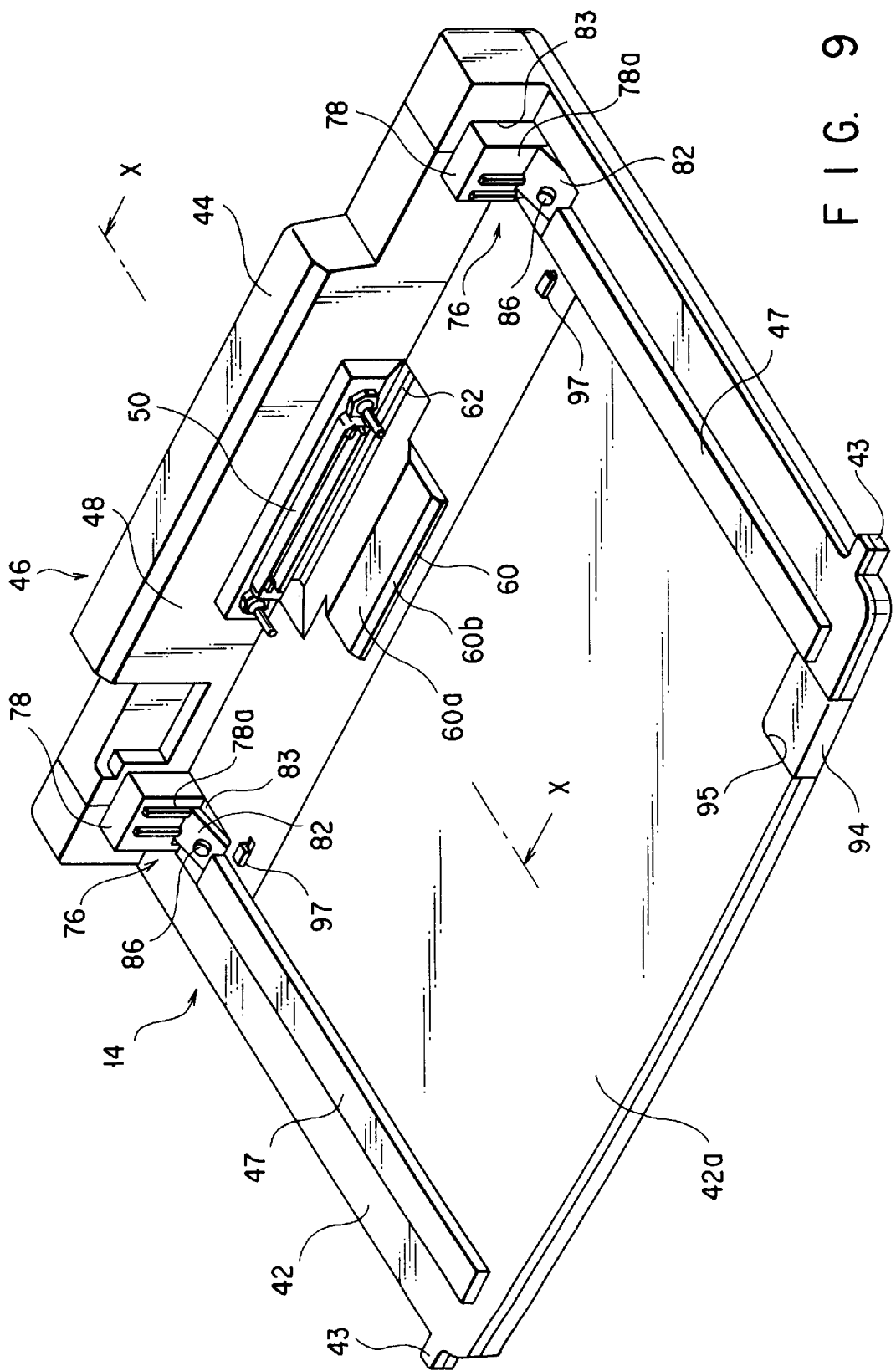

The following is a description of the expansion adapter 14 to which is connected the personal computer 10 constructed in the aforesaid manner. As shown in FIG. 9, the adapter 14, which functions as a connectable apparatus, has an adapter body 46 that includes a flat, substantially rectangular carrying section 42 and a connector setting section 44 set up vertically on the rear end of the carrying section. The carrying section 42 has a rectangular form that is a little larger than the plane configuration of the personal computer 10, and its top surface constitutes a flat carrying surface 42a that carries the computer 10 thereon. Lugs 43 protrude individually from the opposite side edges of the front end portion of the carrying section 42. A finger can be hooked on each lug 43 in removing the expansion adapter 14 from the expansion apparatus 12.

A pair of guide rails 47 are provided on the carrying surface 42a and extend close to the connector setting section 44 from the front end of the surface 42a. These rails 47 extend parallel to each other and at right angles to the setting section 44, and are spaced at a distance substantially equal to the width of the guide projection 36 on the base of the personal computer 10. In connecting the computer 10 to the expansion adapter 14, the casing of the computer is placed on the guide rails 47 with the projection 36 situated between the rails 47, and the computer is slid along the rails toward the connector setting section 44.

Figure 10:
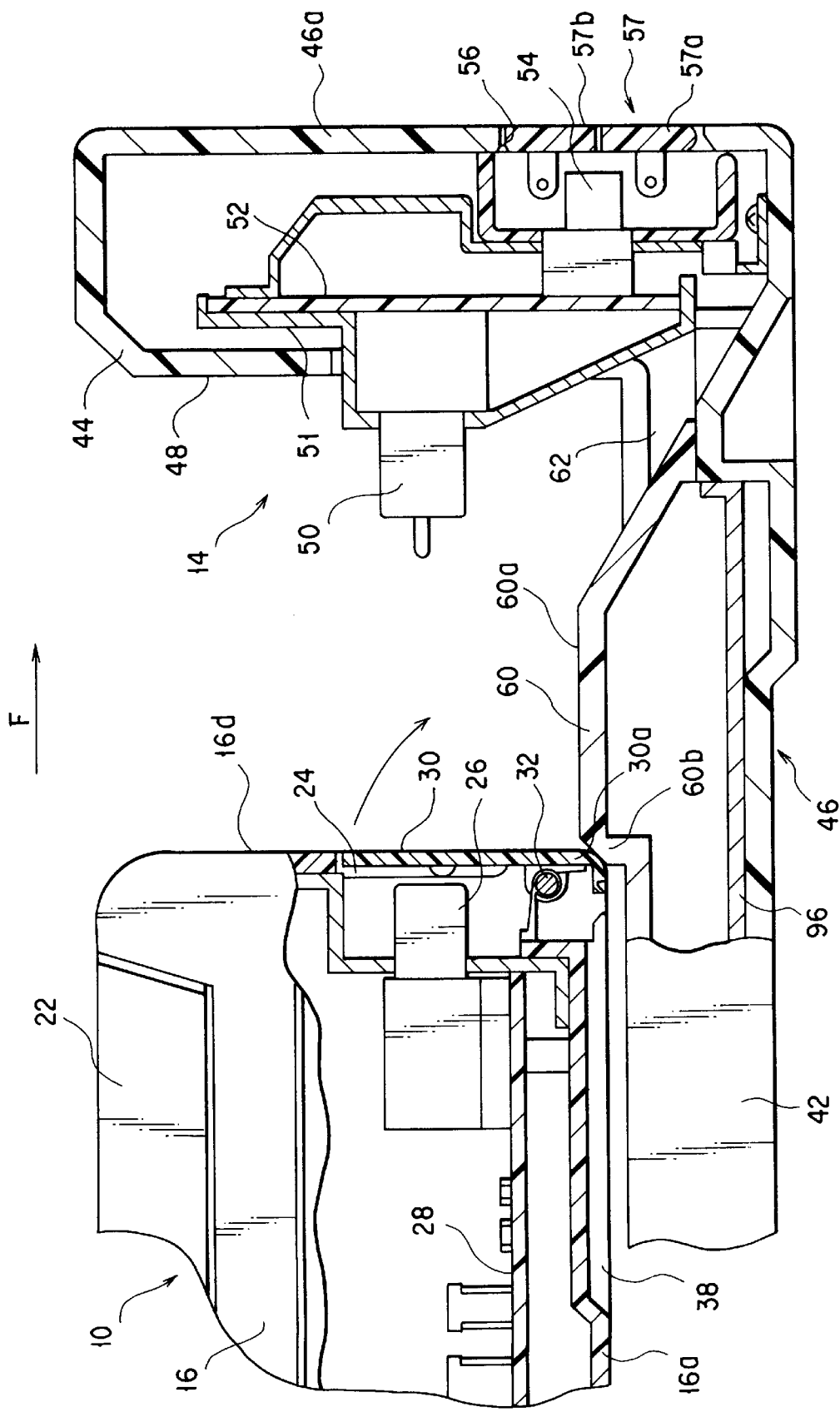

As shown in FIGS. 9 and 10, the connector setting section 44 has a connector setting surface 48 that is raised substantially upright from the rear end of the carrying surface 42a and extends in the transverse direction of the surface 42a. A first relay connector 50, which is connectable with the first expansion connector 26 of the personal computer 10, is provided in the central potion of the setting surface 48 with respect to the transverse direction thereof. The connector 50, which serves as a second connector, is supported by a support frame 51 in the setting section 44 and projects perpendicularly from the connector setting surface 48.

In the connector setting section 44, a printed circuit board 52 is located extending parallel to the connector setting surface 48, and is fixed to the support frame 51. The first relay connector 50 is fixed to one surface side of the board 52.

A second relay connector 54 is located in the lower end portion of the connector setting section 44. The connector 54 is fixed to the other surface side of the printed circuit board 52, and is supported by the support frame 51. Thus, the second relay connector 54 is connected electrically to the first relay connector 50 through the board 52, and faces the rear wall 46a of the adapter body 46.

Figure 11:
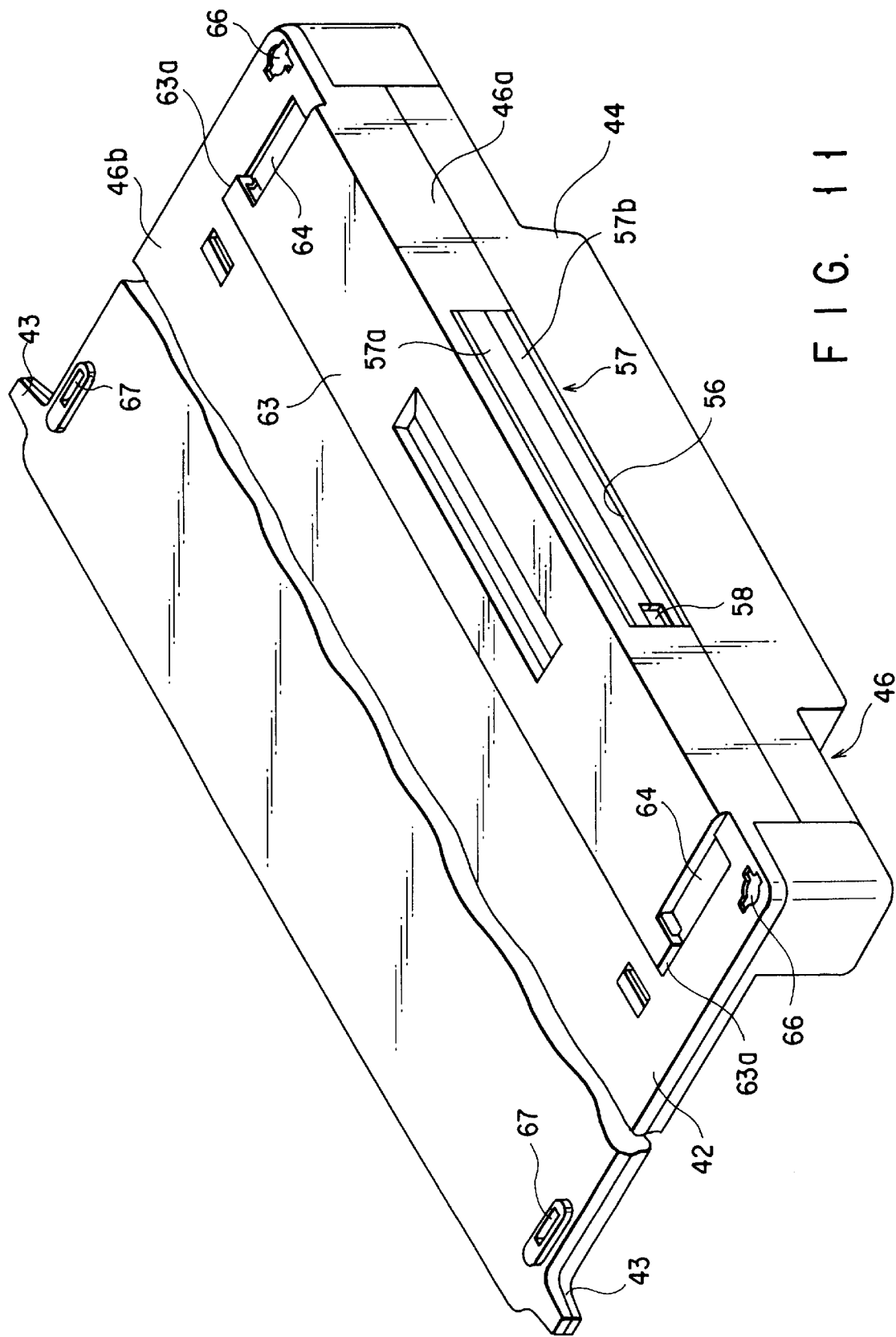

As shown in FIGS. 10 and 11, an aperture 56 is formed in the center of the lower end portion of the rear wall 46a of the adapter body 46, and faces the second relay connector 54. A connector cover 57 is vertically divided in two, first and second covers 57a and 57b. The covers 57a and 57b are swingable between a closed position, in which they are flush and continuous with each other so that the aperture 56 is closed thereby, and an open position, in which they are vertically swung apart to open the aperture 56.

Normally, the first and second covers 57a and 57b are held in the closed position by means of torsion springs (not shown). A lever slot 58 is formed at the corresponding end portions of the covers 57a and 57b.

As shown in FIGS. 9 and 10, a pushing projection 60 for undoing the connector cover 30 of the personal computer 10 is provided on the center of the rear end portion of the carrying surface 42a. The projection 60 is located at a predetermined distance, on the front end side of the surface 42a, from the first relay connector 50. The pushing projection 60 is substantially rectangular in shape, and its top surface 60a is a flat surface that extends parallel to the carrying surface 42a.

The height of the pushing projection 60 is adjusted to a value such that a front-end angle portion 60b of the projection 60 engages the push portion 30a of the connector cover 30 of the personal computer 10 placed on the carrying surface 42a. Also, the projection 60 is small enough to be housed in the holding recess 38 in the bottom wall 16a of the computer 10.

A cover storing recess 62 for storing the undone connector cover 30 of the personal computer 10 is formed in that portion of the carrying surface 42a which is situated between the pushing projection 60 and the first relay connector 50. The recess 62 extends declining toward the lower end portion of the connector setting section 44.

As shown in FIG. 11, a flat, substantially rectangular guide projection 63 is formed on the rear portion of a bottom wall 46b of the expansion adapter 14. The projection 63 extends substantially throughout the transverse length of the base of the adapter body 46, and is continuous with the rear wall 46a of the adapter body. The guide projection 63 functions as second guide means for the attachment of the expansion adapter 14 to the expansion apparatus 12, as mentioned later, and its width is substantially equal to the distance between guide rails of the apparatus 12. Opposite side edges 63a of the projection 63 extend parallel to the side edges of the adapter body 46, and serve as guide surfaces.

A pair of guide grooves 64 are formed individually on the opposite end portions of the guide projection 63 in the transverse direction thereof. The grooves 64 extend parallel to the side edges of the adapter body 46. Further, locking holes 66 for use as first engaging portions are formed individually in the opposite rear-end corner portions of the bottom wall 46b of the adapter body 46. Moreover, elongate rectangular fitting grooves 67 are formed individually in the vicinity of the opposite side edges of the bottom wall 46b at the front end thereof.

The expansion adapter 14 is provided with a detachment mechanism 68, which functions as locking means and first locking means for locking the personal computer 10 in a connected position such that its first expansion connector 26 is connected to the first relay connector 50. Also, the mechanism 68 serves to disconnect the connectors 26 and 50 from each other and eject the computer 10 from the adapter 14.

As shown in FIGS. 9, 12, 13 and 14, the detachment mechanism 68 is provided with a slide plate 70 in the form of an elongate belt. The slide plate 70 is slidable on the inner surface of the bottom wall 46b of the adapter body 46, in directions perpendicular to the connector setting section 44, that is, in the directions of connecting and disconnecting of the first relay connector 50. Also, the plate 70 extends substantially throughout the transverse length of the base of the adapter body 46. The slide plate 70 has a pair of legs 72 that extend close to the rear wall of the adapter body 46 from the opposite end portions of the plate 70, individually, along the directions of connecting and disconnecting of the first relay connector 50. The slide plate 70 serves both as a slide member and support means.

A mounting piece 74 extends inward from the extended end portion of each leg 72 with respect to the adapter body 46. Also, the extended end of each leg 72 is formed with a fitting hole 75, which can be in alignment with its corresponding locking hole 66 of the adapter body 46. The fitting holes 75 serve as second engaging portions.

A tension spring 79 is stretched between a spring peg 70a formed on each end of the slide plate 70 and a spring peg 77 set up on the inner surface of the bottom wall 46b. The plate 70 is urged toward the front end of the adapter body 46 by the springs 79, whereby it is held in its initial position shown in FIG. 12.

A locking-pushing unit 76 is mounted on each mounting piece 74 of the slide plate 70. The unit 76 includes a pushing block 78 in the form of a hollow rectangular box and a locking plate 82 swingably supported on a bracket 80. The block 78 and the bracket 80 are fixed to the mounting piece 74 by means of screws 81.

Each pushing block 78, for use as a pushing member, has a pushing surface 78a, which extends at right angles to the carrying surface 42a and parallel to the connector setting surface 48. Further, the adapter body 46 is formed with an aperture 83, which extends along the surfaces 42a and 48, and the greater part of each block 78 is located in the aperture 83.

The bracket 80 of each locking-pushing unit 76 is fitted with a rotating shaft 84, which extends parallel to the bottom wall 46b. Each locking plate 82, for use as a locking member, is swingably supported on the shaft 84, and projects in front of the pushing block 78. Also, the plate 82 is urged toward the bottom wall 46b by means of a torsion spring (not shown) that is wound on the shaft 84. A locking pin 86 protrudes substantially from the center of the upper surface of each locking plate 82, and is situated adjacent to the rear end of each corresponding guide rail 47. Further, an arcuate guide protuberance 87 protrudes from the lower surface of each locking plate 82.

Underlying and facing each locking plate 82, a guide plate 88 as a guide member is fixed to the inner surface of the bottom wall 46b of the adapter body 46. The top surface of the guide plate 88 includes a flat surface 88a and a slanting surface 88b that is inclined upward from the rear end of the flat surface to the rear wall 46a of the adapter body 46. The guide protuberance 87 of each locking plate 82 is pressed against the top surface of the guide plate 88 by means of the urging force of the aforesaid torsion spring, and can slide on the flat and slanting surfaces 88a and 88b as the slide plate 70 moves.

On the other hand, the detachment mechanism 68 comprises an ejector lever 90 and a swing lever 92. The ejector lever 90 is located on the inner surface of the bottom wall 46b of the adapter body 46 so as to be slidable along the directions of the connector attachment and detachment. The swing lever 92 is swingable around a pivot 91 that is fixed to the inner surface of the bottom wall 46b.

One end of the swing lever 92 is rotatably connected to the central portion of the front end of the slide plate 70, while the other end thereof is rotatably coupled to the rear end of the ejector lever 90. Moreover, an ejector button 94 is attached to the front end of the lever 90, which serves as an ejector member. The button 94 is situated in an aperture 95 that is formed in the front end portion of the carrying surface 42a and the front edge of the adapter body 46, and can be operated from the front end side of the adapter body 46.

A shield plate 96 (see FIG. 10) is provided in the adapter body 46, substantially covering its whole base. Also, a pair of L-shaped conduction catches 97 protrude from the carrying surface 42a of the expansion adapter 14, and are situated adjacent to the respective rear end portions of their corresponding guide rails 47. These catches 97 are connected electrically to the shield plate 96.

In connecting the personal computer 10 to the expansion adapter 14 constructed in this manner, the computer 10 is first placed on the carrying surface 42a of the adapter 14, as shown in FIG. 1. In doing this, the computer 10 is set in a manner such that the guide projection 36 on its base is situated between the guide rails 47 of the adapter 14, and that the rear wall 16d of the computer faces the connector setting portion 44 of the adapter 14.

Then, the personal computer 10 is pushed in the direction indicated by arrow F in FIG. 1, whereupon it slides along the guide rails 47 toward the connector setting section 44. When the rear end portion of the computer 10 approaches the setting section 44, the push portion 30a of the connector cover 30 on the rear wall 16d of the computer abuts against the front-end angle portion 60b of the pushing projection 60 that protrudes from the carrying surface 42a of the expansion adapter 14, as shown in FIG. 10.

Figure 16:
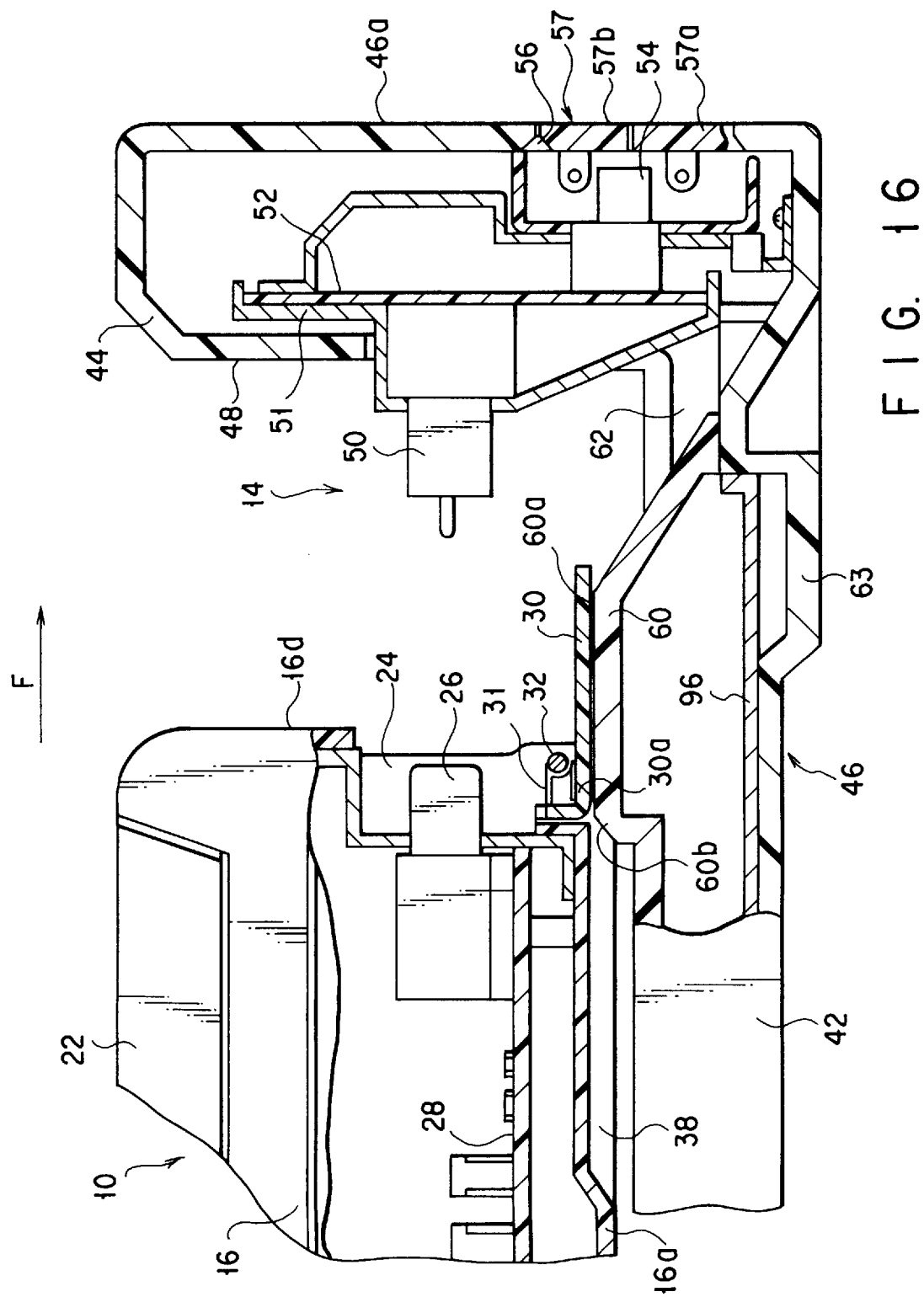

When the personal computer 10 in this state is further pushed in the direction of arrow F, the push portion 30a of the connector cover 30 is pressed by the pushing projection 60, whereupon the cover 30 swings around the shaft 32 to the open position, and comes into contact with the top surface 60a of the projection 60, as shown in FIG. 16. Thus, as the computer 10 moves, the connector cover 30 is automatically swung down to open the aperture 24 in the rear wall 16d of the computer 10, thereby exposing the first expansion connector 26.

Figure 17:
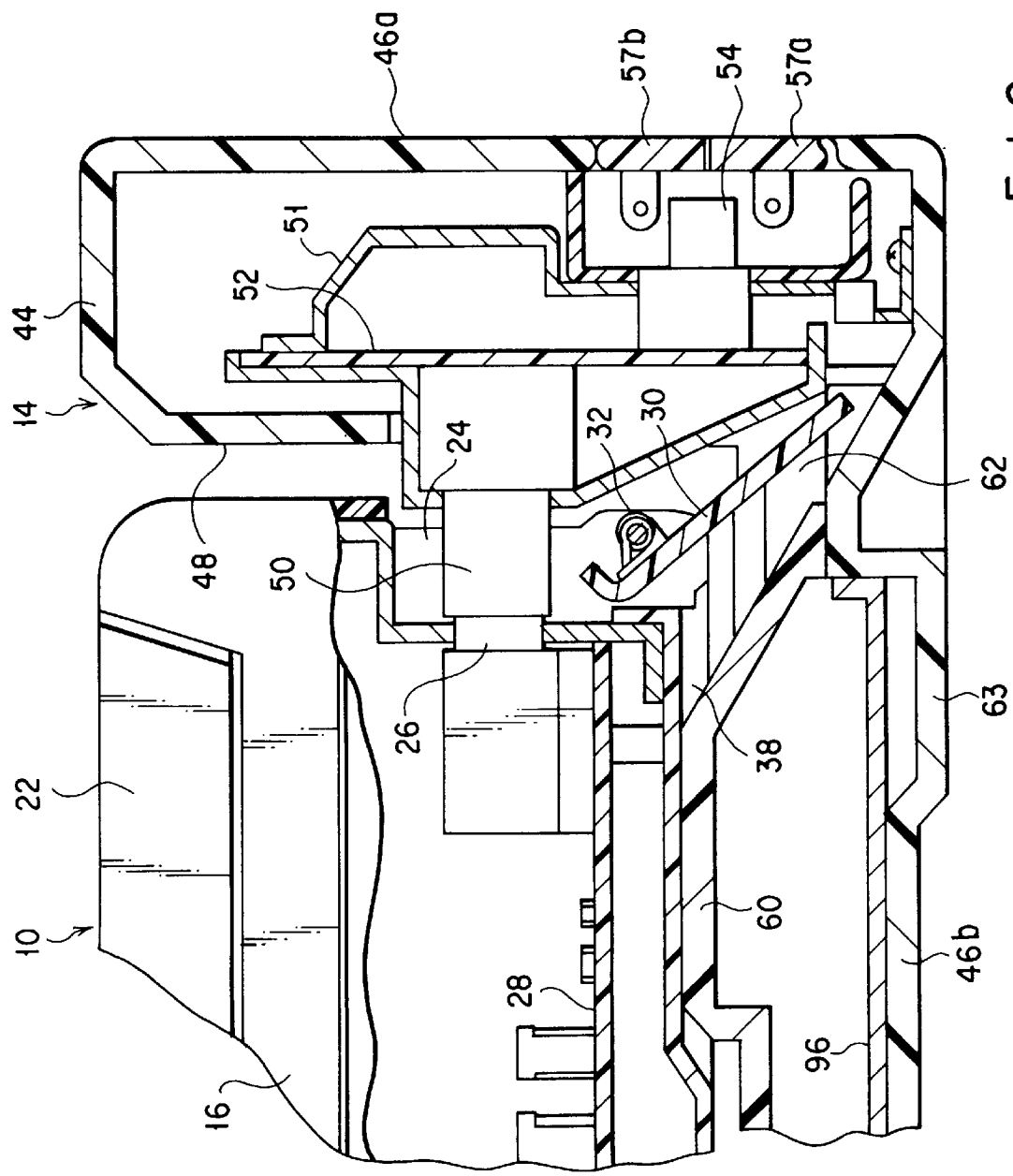

When the personal computer 10 is further pushed in the direction of arrow F, the first expansion connector 26 is connected to the first relay connector 50 of the expansion adapter 14 through the aperture 24, as shown in FIG. 17. As this is done, the connector cover 30 is kept in the open state by sliding on the top surface 60a of the pushing projection 60. After the connection between the connectors 26 and 50 is started, moreover, the cover 30 is inserted into the cover storing recess 62 in the adapter body 46.

Figure 12:
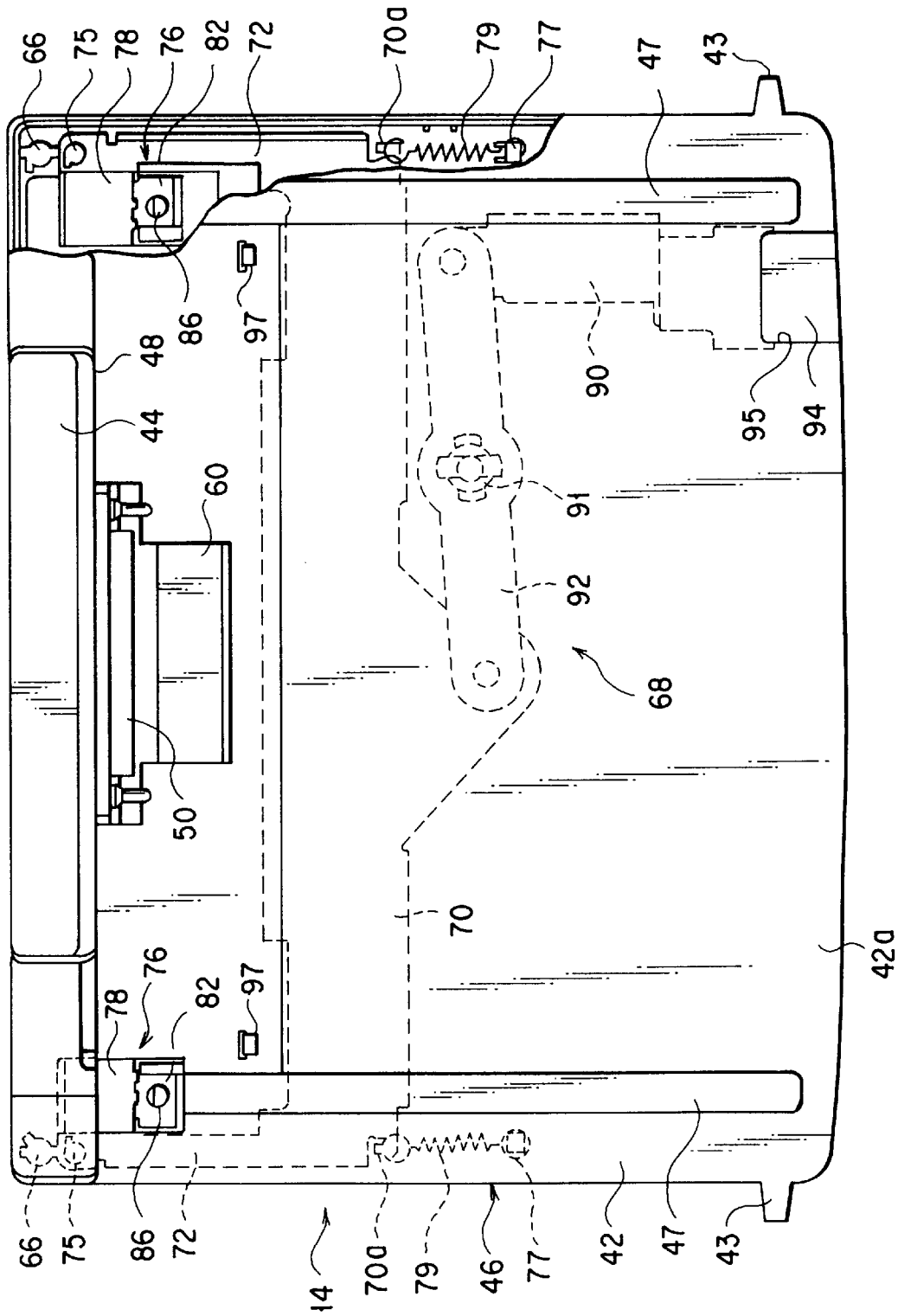
Figure 13:
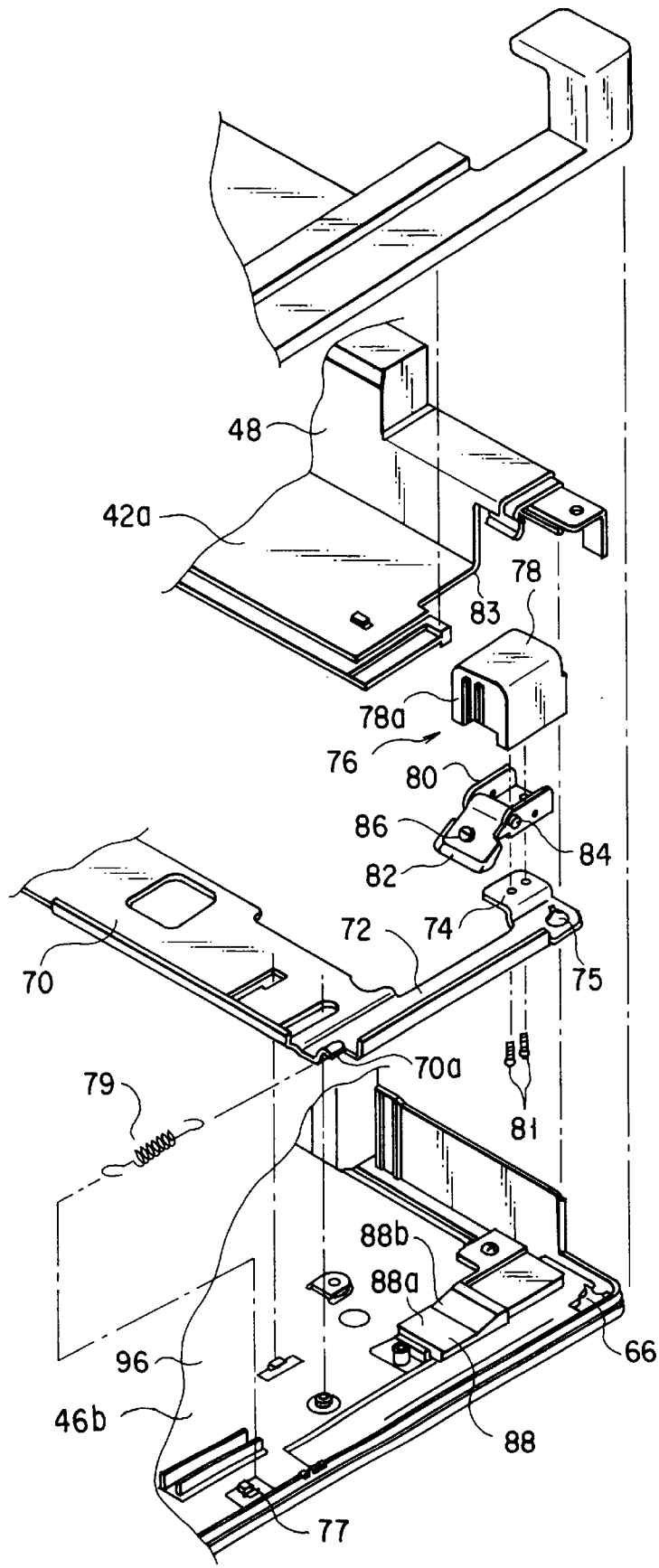
Figure 14:
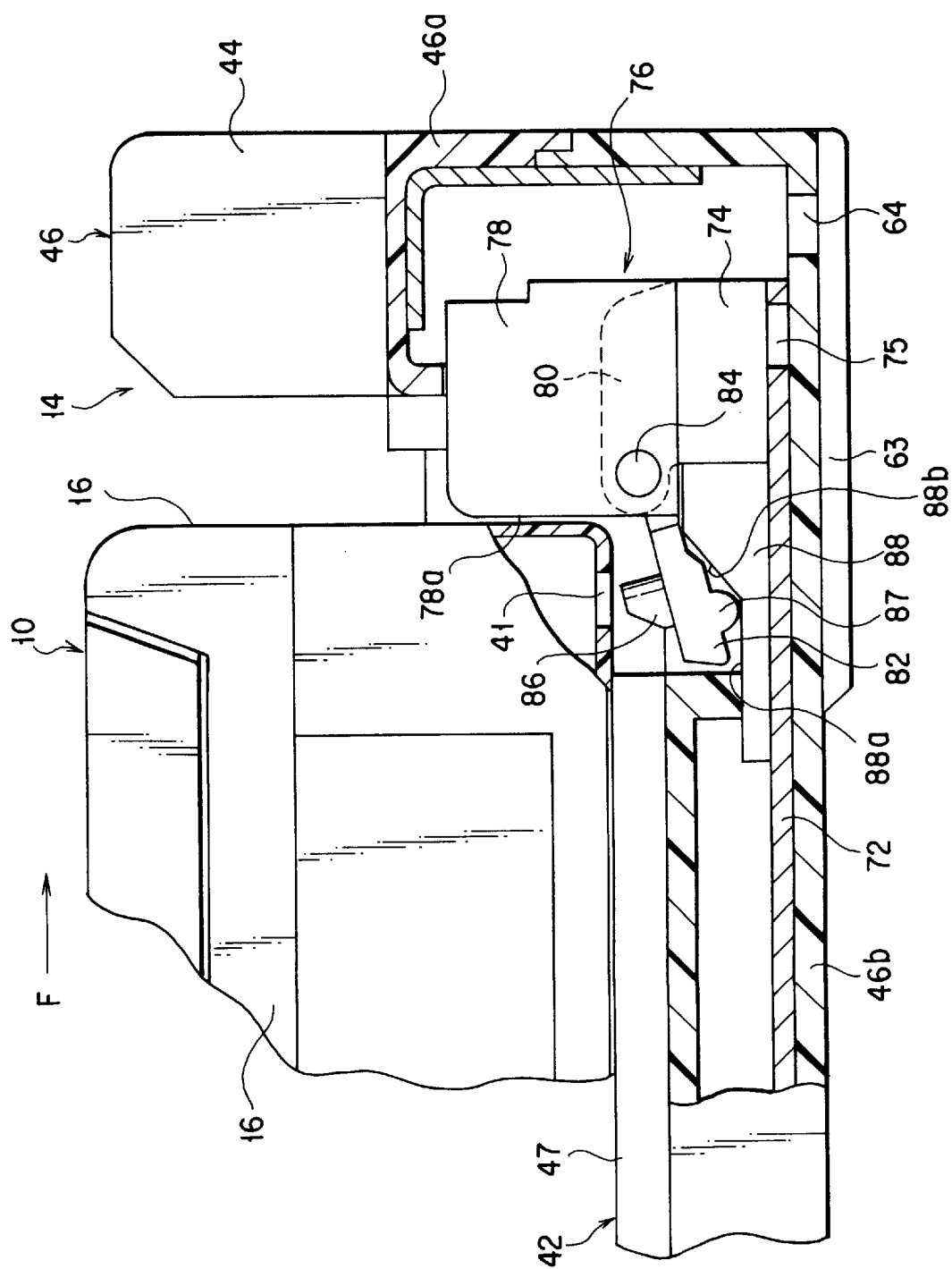

Before the aforesaid connecting operation for the personal computer 10 is started, on the other hand, the slide plate 70 of the detachment mechanism 68 is situated in the initial position. As shown in FIGS. 9, 12 and 14, moreover, the pushing block 78 of each locking-pushing unit 76 is situated projecting forward from the connector setting surface 48 of the adapter body 46. Further, the locking plate 82 of each unit 76 is held in a release position such that it is inclined inside the aperture 83 with its guide protuberance 87 in contact with the flat surface 88a of the guide plate 88. Thus, the locking pin 86 of each locking plate 82 is situated below the top surface of each corresponding guide rail 47.

When the slide plate 70 is in the initial position, moreover, each fitting hole 75 of the plate 70 is situated with a forward deviation from its corresponding locking hole 66 that is formed in a rear-end corner portion of the bottom wall 46b of the adapter body 46. As seen from FIG. 12, furthermore, the ejector lever 90 of the detachment mechanism 68 is in a moved position on the side of the connector setting section 44, and the ejector button 94 is situated in the aperture 95 so as to be flush with the carrying surface 42a and the front end edge of the adapter body 46.

When the personal computer 10 is pushed in so that its rear wall 16d approaches the connector setting surface 48 of the adapter body 46 during the aforementioned connecting operation, the lower part of the rear wall 16d abuts against the respective pushing surfaces 78a of the two pushing blocks 78, as shown in FIG. 14.

In this state, the locking plate 82 of each locking-pushing unit 76 is in its release position, and each locking pin 86 is held in a position lower than the level of the top surface of each corresponding guide rail 47. Accordingly, the personal computer 10 can smoothly move to the position where it abuts against the pushing blocks 78, without causing its base to be caught by the locking pins 86. When the computer 10 is pushed in so that the rear wall 16d abuts against the respective pushing surfaces 78a of the pushing blocks 78, the fitting holes 41 in the opposite rear-end corner portions of the bottom wall of the computer face the respective locking pins 86 of their corresponding locking plates 82, individually.

The personal computer 10 in this state is further pushed in the direction of arrow F so that the first expansion connector 26 is connected to the first relay connector 50, the two pushing blocks 78 are pushed into the connector setting section 44 by the rear wall 16d of the computer 10, and their respective pushing surfaces 78a become substantially flush with the connector setting surface 48.

The locking plate 82 of each locking-pushing unit 76, along with its corresponding pushing block 78, moves rearward. As the plate 82 moves in this manner, its guide protuberance 87 slides on the slanting surface 88b of the guide plate 88, and the plate 82 swings upward to a locking position in which it extends substantially parallel to the carrying surface 42a. As a result, the locking pin 86 of each locking plate 82 is fitted into its corresponding fitting hole 41 of the personal computer 10, whereby the computer is locked in the connected position.

Figure 18:
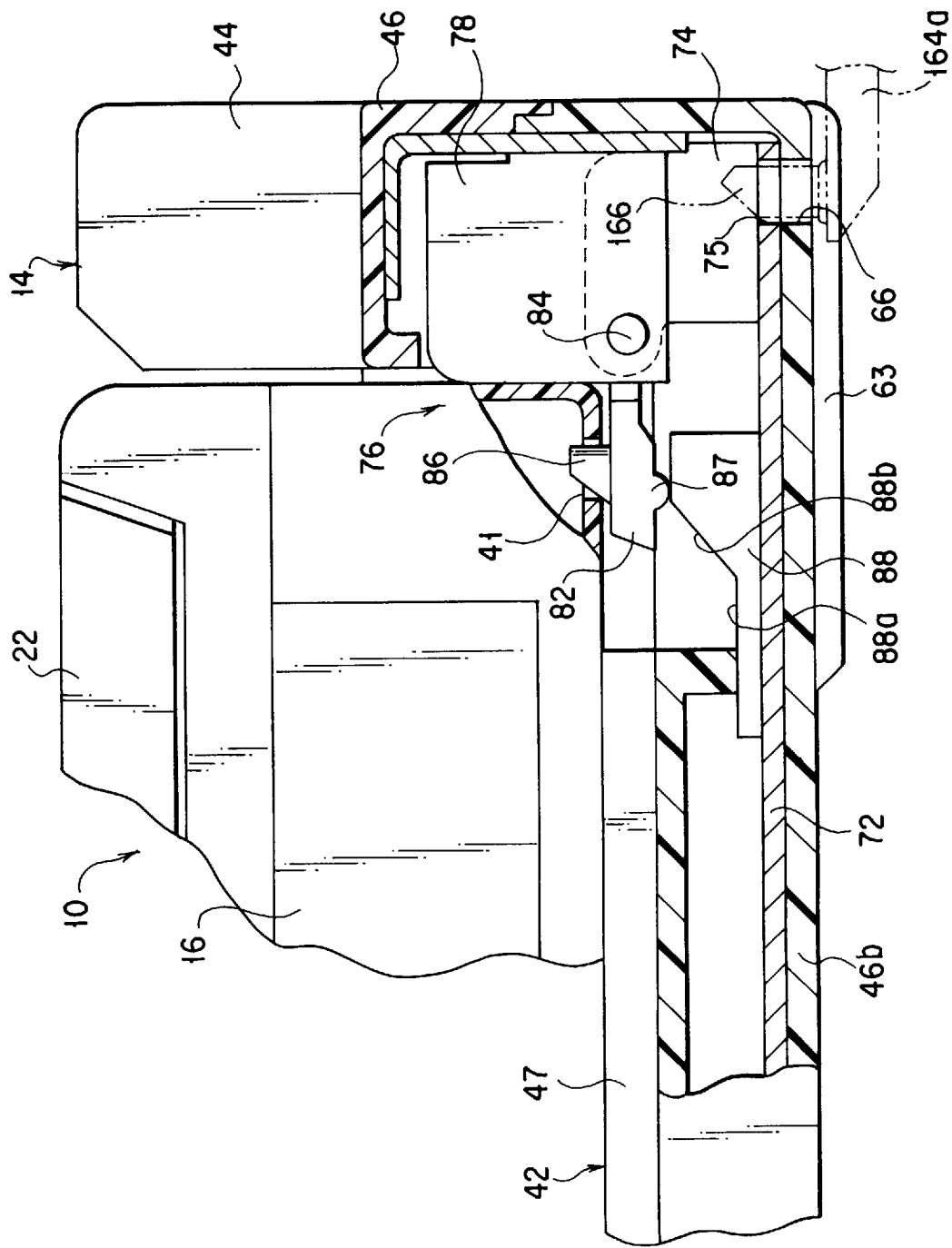

When the two pushing blocks 78 are pushed and moved by the personal computer 10, the slide plate 70 is moved integrally with the pushing blocks 78, from the initial position to a recessed position. In the recessed position, as shown in FIGS. 15 and 18, the two fitting holes 75 of the slide plate 70 are situated in alignment with their corresponding locking holes 66 in the opposite rear-end corner portions of the bottom wall 46b of the adapter body 46.

Figure 15:
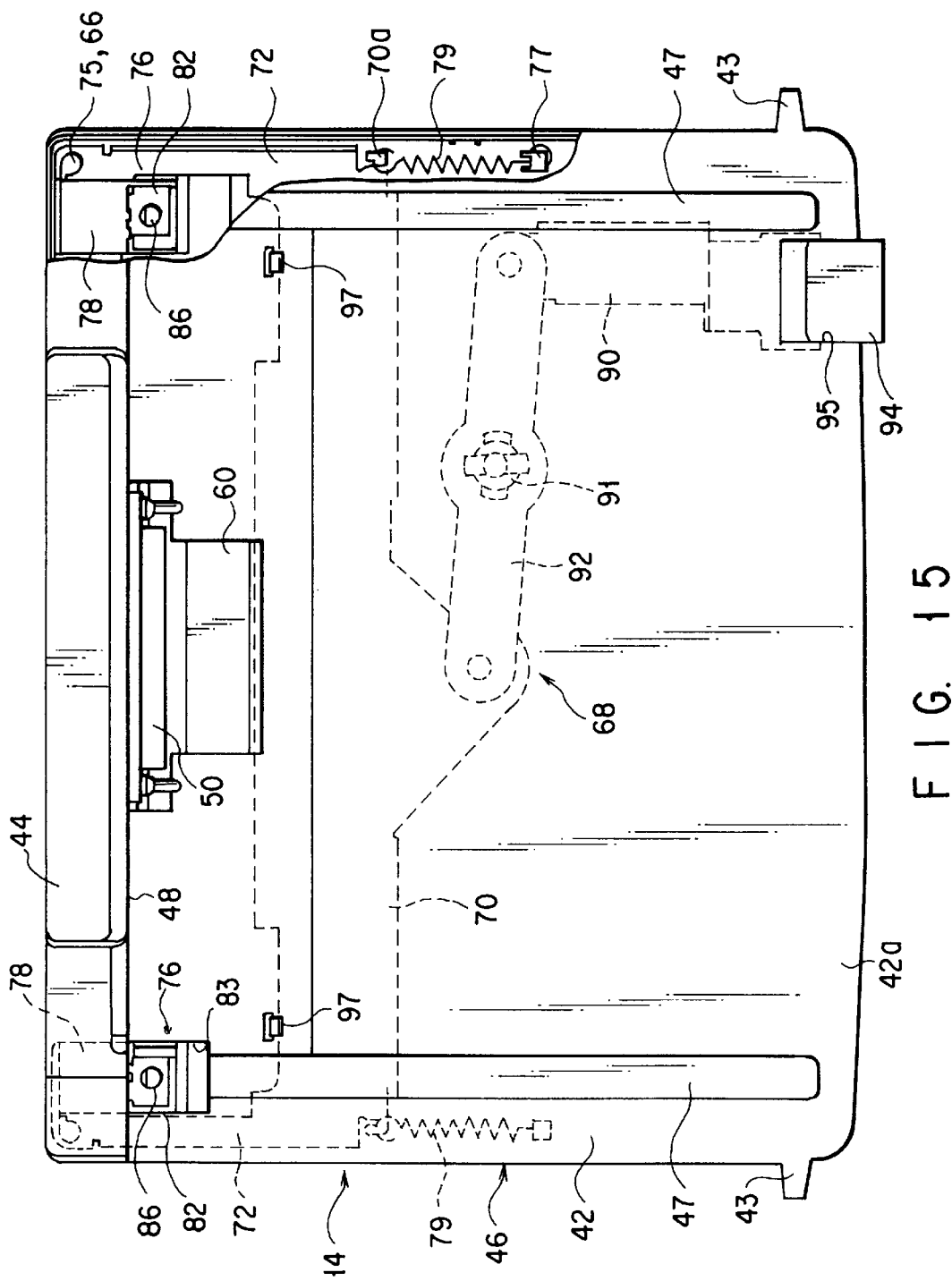

As the slide plate 70 moves, as seen from FIG. 15, moreover, the swing lever 92 of the detachment mechanism 68 swings clockwise around the pivot 91, thereby causing the ejector lever 90 to slide toward the front end of the adapter body 46. Thereupon, the ejector button 94 moves to a projected position in which it projects forward from the front end edge of the adapter body 46.

By the operation described above, the personal computer 10 is connected to the expansion adapter 14 and locked in its connected position. During this connecting operation, the two conduction catches 97, which protrude from the carrying surface 42a of the adapter 14, move individually along the guide grooves 40 that are formed on the guide projection 36 of the computer 10, and come into contact with their corresponding conduction portions (not shown) in the computer. As a result, the shield plate 96 of the expansion adapter 14 is connected to the ground in the personal computer 10 through the conduction catches 97.

In removing the personal computer 10 from the expansion adapter 14, the ejector button 94 of the detachment mechanism 68 in the projected position is depressed. Thereupon, the ejector lever 90 is pushed in toward the connector setting section 44, and at the same time, the swing lever 92 swings in the counterclockwise direction of FIG. 15 around the pivot 91. As a result, the slide plate 70 is moved from the recessed position to the initial position.

As the slide plate 70 moves in this manner, the two pushing blocks 78 move so as to project from the connector setting surface 48, while pressing the rear wall 16*d* of the personal computer 10 so that it moves away from the setting surface 48. As a result, the computer 10 is moved forward with respect to the adapter body 46, whereupon the first expansion connector 26 is disengaged from the first relay connector 50.

As the pushing blocks 78 move, moreover, the guide protuberance 87 of each locking plate 82 slides forward along the slanting surface 88*b* of its corresponding guide plate 88, so that the locking plate 82 swings from the locking position to the release position. Thereupon, each locking pin 86 is disengaged from its corresponding fitting hole 41 of the computer 10, so that the computer is unlocked.

As a result of this operation, the first expansion connector 26 and the first relay connector 50 are disconnected from each other, and the personal computer 10 is unlocked and removed from the expansion adapter 14. Disconnecting the connectors 26 and 50 requires a relatively large force. Ejecting operation can be carried out easily by depressing the ejector button 94 with fingers on the lugs 43 that protrude individually from the opposite side edges of the front end portion of the adapter body 46.

The following is a description of the expansion apparatus 12 to which the personal computer 10 is connected by means of the expansion adapter 14 described above. As shown in FIGS. 1 and 2, the expansion apparatus 12 has an apparatus body 100 in the form of a rectangular box. The top surface of the body 100 includes a horizontal carrying surface 102 and a connector setting surface 104 set up vertically on the rear end of the surface 102. An A4 notebook type personal computer (not shown) or the expansion adapter 14 is alternatively placed on the carrying surface 102.

The carrying surface 102 has a rectangular form that is substantially equal in size to the base of the A4 notebook type personal computer or the expansion adapter 14. A pair of belt-shaped guide rails 106, right and left, for use as second guide means are arranged individually on the opposite side edge portions of the carrying surface 102, and extend close to the connector setting surface 104 from the front end of the surface 102. These rails 106 extend parallel to each other and at right angles to the setting surface 104, and are spaced at a distance substantially equal to the width of the guide projection 63 (see FIG. 11) on the bottom of the expansion adapter 14. In connecting the adapter 14 to the expansion apparatus 12, the base of the adapter is placed on the guide rails 106 with the projection 63 situated between the rails 106, and the adapter is slid along the rails toward the connector setting surface 104.

A second expansion connector 108, which is connectable with the second relay connector 54 of the expansion adapter 14, is provided projecting from the central potion of the connector setting surface 104 with respect to the transverse direction thereof. The connector 108 is supported by a support frame (not shown) in the apparatus body 100 and projects perpendicularly from the connector setting surface 104 over the carrying surface 102.

A substantially U-shaped release member 110 is provided projecting from the connector setting surface 104 and surrounding the second expansion connector 108. The release member 110 is formed so as to cover both lateral faces and underside of the connector 108, and projects forward beyond the connector 108. The member 110 can advance and retreat at right angles to the setting surface 104.

In connecting the expansion adapter 14, as mentioned later, the release member 110 is pushed into the connector setting surface 104 by the adapter 14. In ejecting the adapter 14, the member 110 presses the rear wall 46*a* of the adapter forward.

Also, an opening lever 112 protrudes from the release member 110, and serves to undo the connector cover 57 that is attached to the rear wall 46*a* of the expansion adapter 14. When the adapter 14 on the carrying surface 102 is slid toward the connector setting surface 104, the lever 112 is inserted into the lever slot 58 of the connector cover 57, thereby causing the first and second covers 57*a* and 57*b* of the connector cover swing from the closed position to the open position.

Arranged on the front face of the apparatus body 100 are a slot 114 in which a CD-ROM drive or floppy disk drive is mounted alternatively, a power switch 116, an ejector button 118, an indicator 120 for indicating the operation state of the expansion apparatus 12, and a speaker 122 for voice output.

Arranged on a side face of the apparatus body 100, moreover, are card slots 123 and 124 through which expanded-capability cards are loaded into the apparatus, a board slot 126 through which an expansion board is inserted into the apparatus, a key cylinder 128, etc. The key cylinder 128 can be switched between a blocking position in which the operation of a locking-ejecting mechanism (mentioned later) is restrained, a standard operation position, and an emergency release position.

Arranged in the apparatus body 100, furthermore, are various devices for extending the functions of the personal computer, various connectors for the connection with other external equipment, etc.

Figure 19:
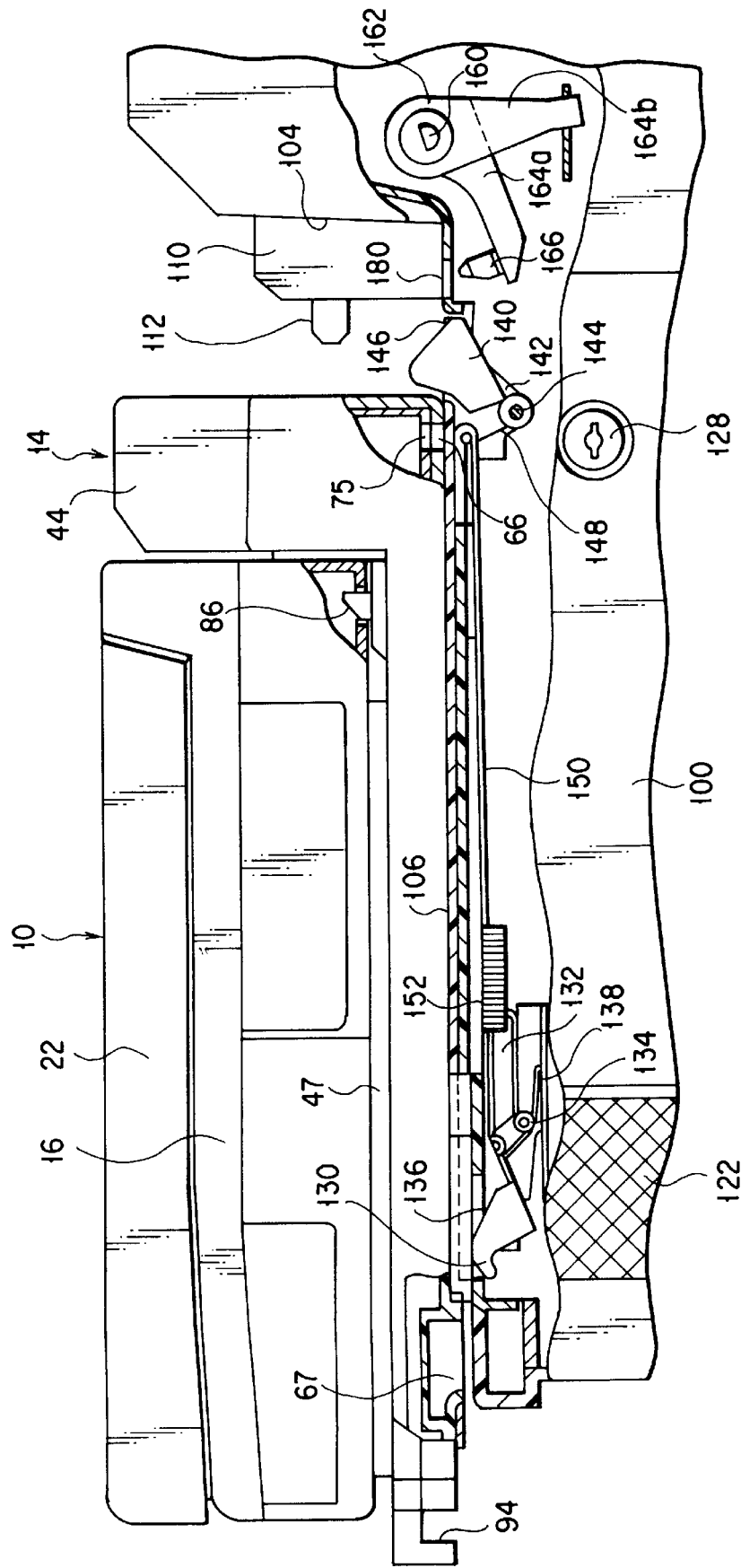

As shown in FIGS. 1 and 19, retractable latches 130 (only one of which is shown) are arranged individually under the respective front ends of the guide rails 106. When the expansion adapter 14 on the carrying surface 102 is slid along the rails 106 toward the second expansion connector 108, these latches 130 detachably engage the fitting grooves 67 at the front end of the base of the adapter body 46, thereby holding the front end portion of the adapter 14 in position.

Each latch 130 is swingably supported by a pivot 134 on a bracket 132 that is fixed to the underside of the carrying surface 102. Also, each latch 130 is swingable between an engaged position, in which it projects above its corresponding guide rail 106 through an aperture 136 in the carrying surface 102, and a release position in which it is situated below the surface 102. Normally, each latch 130 is urged toward the release position by a torsion spring 138 that is wound around the pivot 134.

Detecting levers 140 (only one of which is shown) are arranged individually at the respective rear end portions of the guide rails 106. These levers 140 are used to detect the position of the expansion adapter 14 sliding on the carrying surface 102. The levers 140 and the latches 130 are located at the opposite end portions of their corresponding guide rails 106 in the longitudinal direction thereof.

As shown in FIG. 19, each detecting lever 140 is swingably supported by a pivot 144 on a support wall 142 that protrudes from the inner surface of the carrying surface 102.

Each lever 140 is swingable between a first position, in which it projects above the top surface of the guide rail 106 through an aperture 146 in the rear end of the rail 106, and a second position in which it is confined within the aperture 146. Normally, each lever 140 is urged toward the first position by a torsion spring 148 that is wound around the pivot 144.

The latch 130 and the detecting lever 140 in each pair are connected to each other by means of a connecting rod 150, and can interlock through the medium of the rod 150. The connecting rod 150 extends under its corresponding guide rail 106 in the longitudinal direction thereof. Also, the rod 150 is formed of a metal wire, and its middle portion is coiled to form an elastically deformable portion 152. As the deformable portion 152 undergoes elastic deformation, the rod 150 can extend or contract in its axial direction.

On the other hand, the expansion apparatus 12 comprises a locking-ejecting mechanism 154, which serves as second locking means for locking the expansion adapter 14 and the personal computer 10 connected thereto in a state such that the second relay connector 54 of the adapter 14 is connected to the second expansion connector 108. The mechanism 154 also serves to disconnect these connectors from each other.

Figure 20A:
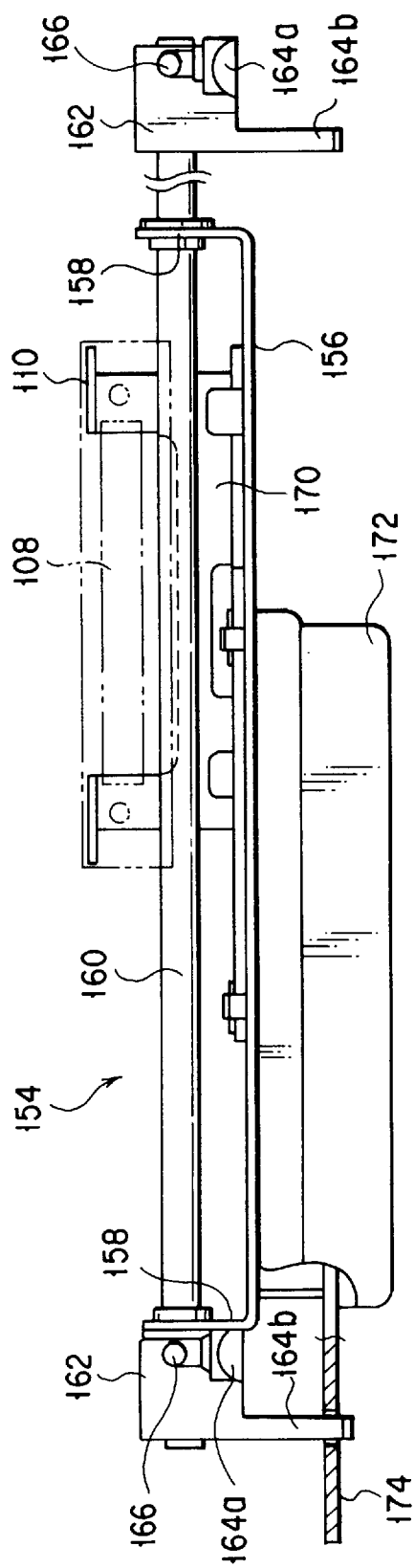
FIG. 20A is a front view schematically showing a locking-ejecting mechanism of the expansion apparatus.
Figure 20B:
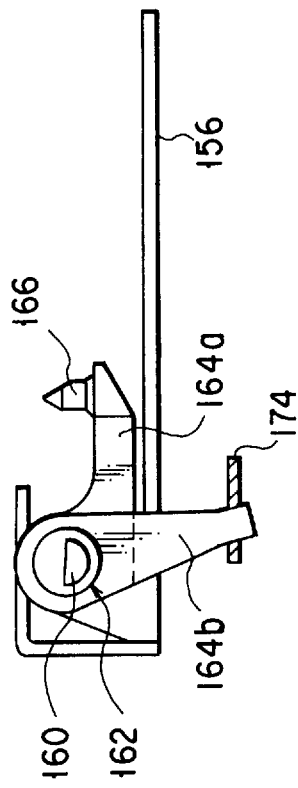
FIG. 20B is a side view showing a locking lever of the locking-ejecting mechanism.

As shown in FIGS. 19, 20A and 20B, the locking-ejecting mechanism 154 is provided with a plate-like bracket 156, which is located horizontally in the rear end portion of the apparatus body 100, and support walls 158 are set up vertically from the opposite end portions of the bracket 156, individually. A support shaft 160 is rotatably supported by the walls 158.

The support shaft 160 extends horizontally in the transverse direction of the apparatus body 100, and a pair of locking levers 162 are mounted individually on its opposite ends. Thus, the levers 162 can swing integrally with each other through the medium of the shaft 160. Each lever 162 includes a first arm 164a extending forward with respect to the casing 100 and a second arm 164b extending downward. A tapered locking pin 166 protrudes upward from the extended end of the first arm 164a.

A plate-like slider 170 is mounted on the upper surface of the bracket 156 so as to be slidable in the horizontal direction, especially at right angles to the connector setting surface 104. The release member 110, which is situated around the second expansion connector 108, is mounted on the slider 170, and can moved integrally with the slider 170.

Further, a drive section 172 for swinging the locking levers 162 and sliding the slider 170 is mounted on the lower surface of the bracket 156. The drive section 172, which functions as drive means, comprises a stepping motor (not shown), a cam mechanism (not shown), a connecting arm 174 connected to the second arm 164b of one of the locking levers 162, etc.

The two locking levers 162 of the locking-ejecting mechanism 154, constructed in the manner described above, are located under the respective rear end portions of their corresponding guide rails 106. As shown in FIGS. 1 and 19, a pin outlet hole 180 is formed in the rear end of each guide rail 106, facing the locking pin 166 of each corresponding locking lever 162.

Each locking lever 162 is swung by the drive section 172 between a locking position, in which the locking pin 166 projects above the corresponding guide rail 106 through the pin outlet hole 180, and an unlocking position, in which the pin 166 is situated below the hole 180.

In connecting the personal computer 10 to the expansion apparatus 12 constructed in this manner, the computer 10 is first connected to the expansion adapter 14 by the aforementioned operation. Then, the adapter 14, along with the computer 10 connected thereto, is connected to the expansion apparatus 12.

In this case, the expansion apparatus 12 is first switched on to be on standby, and the key cylinder 128 is turned to the standard position by means of a key (not shown). Then, the expansion adapter 14 is placed on the carrying surface 102 of the apparatus 12. In doing this, the adapter 14 is set in a manner such that the guide projection 63 on its base is situated between the guide rails 106 of the apparatus 12, and that the second relay connector 54 attached to the rear wall 46a of the adapter 14 faces the second expansion connector 108 of the apparatus 12.

In this state, the expansion adapter 14 is pushed in and slid along the guide rails 106 toward the second expansion connector 108. When the rear wall of the adapter 14 is brought close to the second expansion connector 108 by this sliding operation, the rear-end corner portions of the adapter 14 abut individually against the detecting levers 140, thereby causing the levers 140 to swing toward the second position, as shown in FIG. 19. The swinging motion of these levers 140 is transmitted to the latches 130 through the connecting rods 150, whereupon the latches 130 start to swing from the release position toward the engaged position. As the latches 130 swing in this manner, they are tempted to project above the carrying surface 102 through their corresponding apertures 136.

At this point of time, the fitting grooves 67 at the front end of the base of the expansion adapter 14 are not situated so as to face their corresponding apertures 136 yet, so that the latches 130 run against the base of the adapter 14 and are prevented from swinging. Despite this situation, the detecting levers 140 continue to swing toward the second position, pushed by the adapter 14, so that the connecting rods 150 are pulled so that the elastically deformable portion 152 extends. Thus, the swinging motion of the levers 140 cannot be prevented, and the expansion adapter 14 can be smoothly slid beyond the levers 140 toward the second expansion connector 108.

Practically, moreover, the opening lever 112 on the release member 110 is aligned with the lever slot 58 of the connector cover 57 of the expansion adapter 14 the moment the rear-end corner portions of the adapter 14 abut against the detecting levers 140. As the adapter 14 slides, the lever 112 is inserted into the slot 58, thereby causing the first and second covers 57a and 57b of the cover 57 to swing to the open position. As a result, the second relay connector 54 of the adapter 14 is exposed through the aperture 56.

When the expansion adapter 14 is further slid toward the second expansion connector 108, its rear wall 46a abuts against the front face of the release member 110. Thereupon, the release member slides rearward, and is pushed in toward the connector setting surface 104.

Figure 21:
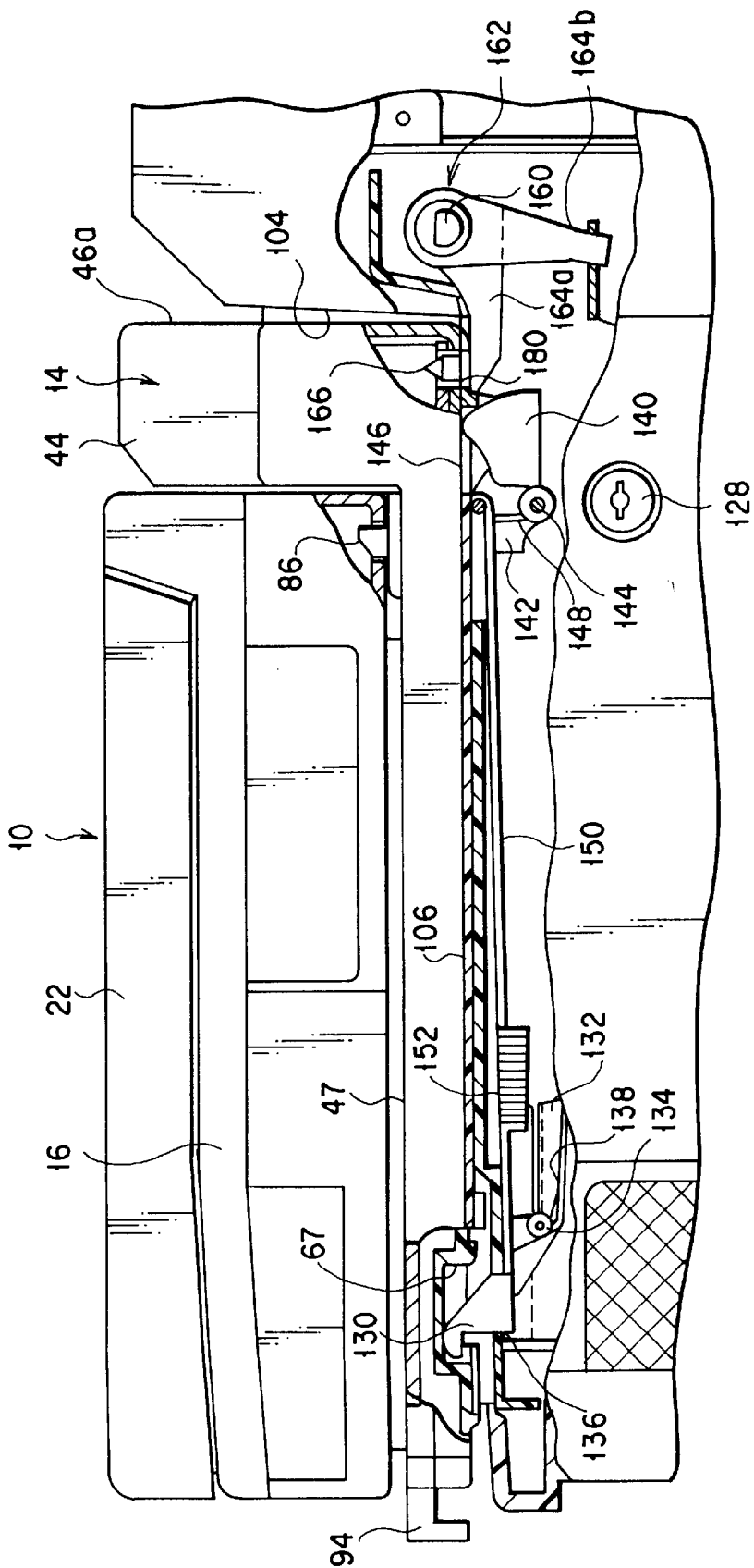

When the second relay connector 54 of the expansion adapter 14 reaches the position just in front of the second expansion connector 108, the fitting grooves 67 at the front end of the adapter 14 face their corresponding apertures 136 of the expansion apparatus 12, as shown in FIG. 21. Accordingly, the latches 130, having so far been abutting against the base of the adapter 14, get into the grooves 67 through the apertures 136, individually.

When the expansion adapter 14 is further slid, the second relay connector 54 is connected to the second expansion connector 108 of the expansion apparatus 12. At the same time, the latches 130 engage the edges of the fitting grooves 67 of the adapter 14, thereby holding and positioning the front end portion of the adapter on the carrying surface 102. Moreover, the locking holes 66 in the rear-end corner portions of the base of the adapter 14 are opposed to their corresponding pin outlet holes 180 in alignment therewith.

As the second relay connector 54 is fitted into the second expansion connector 108 in this manner, the first expansion connector 26 of the personal computer 10 is connected to the connector 108 through the first and second relay connectors 50 and 54. Thereupon, the computer 10 and the expansion apparatus 12 are connected electrically to each other.

After this connection is made, signals are transferred between the expansion apparatus 12 and the personal computer 10. If completion of the connection between these apparatuses is ascertained, locking the computer 10 is started.

More specifically, a control section (not shown) of the expansion apparatus 12 delivers a command to the drive section 172 to lock the personal computer 10. In response to this command, the drive section 172 causes the connecting arm 174 to swing the locking levers 162 from the unlocking position to the locking position. Thereupon, the respective locking pins 166 of the levers 162 project from the guide rails 106 through the pin outlet holes 180, and are fitted individually into the locking holes 66 of the expansion adapter 14 and further into the fitting holes 75 of the slide plate 70 that are in alignment with the locking holes.

Thereupon, the rear and front end portions of the expansion adapter 14 is restrained from moving by the locking pins 166 and the latches 130, respectively. Thus, the adapter 14 is locked in a state such that the second relay connector 54 and the second expansion connector 108 are connected to each other.

At the same time, the slide plate 70 of the expansion adapter 14 is restrained from moving by the locking pins 166, and locked in the recessed position. As this is done, the locking plate 82 of each locking-pushing unit 76 is also locked in the locking position in which the locking pin 86 is fitted in its corresponding fitting hole 41 of the personal computer 10. Even in case the ejector button 94 is depressed by mistake, therefore, the first expansion connector 26 and the first relay connector 50 cannot be disconnected from each other, and the computer 10 is locked so that it is connected to the expansion apparatus 12 by means of the first and second relay connectors 50 and 54.

After the aforesaid connecting operation is completed, the personal computer 10 is switched on to boot up an application, whereupon a series of connecting processes is finished. By shifting the key cylinder 128 to the blocking position by means of the key (not shown) after the completion of the connecting operation, the operation of the locking-ejecting mechanism 154 can be locked so that careless disconnection of the computer 10 and the expansion adapter 14 and stealing of the computer and the like can be prevented.

In removing the personal computer 10 and the expansion adapter 14 from the expansion apparatus 12, on the other hand, the keyboard 18 of the computer 10 is operated to apply an ejection command to the control section of the apparatus 12, or the ejector button 118 of the apparatus 12 is depressed. When the key cylinder 128 is in the clocking position, moreover, it is shifted to the standard operation position by means of the key, whereby the locking-ejecting mechanism 154 is unlocked.

Thereupon, signals are transferred between the control section of the expansion apparatus 12 and the personal computer 10. If there is any live application, a process is carried out to finish it. When the computer 10 is switched off, thereafter, ejecting the expansion adapter 14 is started.

More specifically, the control section of the expansion apparatus 12 delivers a command to the drive section 172 to eject the expansion adapter 14. Thereupon, the drive section 172 causes the locking levers 162 to swing from the locking position to the unlocking position. Thereupon, the respective locking pins 166 of the levers 162 sink below the guide rails 106 through the pin outlet holes 180, and are drawn out individually from the locking holes 66 of the expansion adapter 14 and the fitting holes 75 of the slide plate 70. Accordingly, the rear end portion of the adapter 14 and the slide plate 70 are released from the locking effect of the locking pins 166.

When the locking levers 162 are swung to the unlocking position, the control section causes the slider 170 to slide forward. Thereupon, the release member 110 moves in the direction to project from the connector setting surface 104 of the apparatus body 100, and forces the rear wall 46a of the expansion adapter 14 to move forward. As a result, the second relay connector 54 of the adapter 14 and the second expansion connector 108 of the expansion apparatus 12 are disconnected from each other.

When the expansion adapter 14 is further moved away from the connector setting surface 104 after these connectors are disconnected, the rear end portion of the adapter 14 is separated from the detecting levers 140. Accordingly, the levers 140 are released from the press, and are automatically swung toward the first position by the torsion springs 148.

Correspondingly, the latches 130 are also swung from the engaged position toward the release position by the torsion springs 138, and drawn out individually from the fitting holes 67 of the expansion adapter 14. Thereupon, the front end portion of the adapter 14 is released from the locking effect of the latches 130, so that the adapter 14 can be removed from the carrying surface 102.

According to the electronic processing system constructed in this manner, the use of the expansion adapter 14 enables the B5 notebook type personal computer 10 to be connected to the expansion apparatus 12 that is adapted for use with A4 notebook type personal computers.

In connecting the personal computer 10 to the expansion adapter 14 in the electronic processing system according to the invention, the computer is slid toward the first relay connector 50 of the adapter so that the connector cover 30 of the computer is automatically undone by means of the pushing projection 60 of the adapter, thereby exposing the first expansion connector 26. Accordingly, the connector cover 30 need not be manually removed or swung to permit the connection, so that the connecting operation can be carried out with ease.

Since the connector cover 30 is undone automatically, moreover, there is no possibility of the connector being damaged by a careless attempt at connecting it with the cover on, and the connecting operation can be performed with reliability. Since the connector cover need not be removed, moreover, it cannot be lost.

This automatic uncovering operation can be accomplished with use of a simple, low-priced structure that includes only the pushing projection 60 on the carrying surface 42a of the expansion adapter 14. Since the undone connector cover 30 is bound to be housed in the cover holding recess 62 of the adapter 14, the connectors can be smoothly connected without being hindered by the cover 30.

It is to be understood that the present invention is not limited to the embodiment described above, and that various changes and modifications may be effected therein by one skilled in the art without departing from the scope or spirit of the invention. According to the foregoing embodiment, for example, the invention is applied to the personal computer as the small-sized electronic apparatus and the expansion adapter as the connectable apparatus. Alternatively, however, the invention may be applied to the expansion adapter as the small-sized electronic apparatus and the expansion apparatus as the connectable apparatus. In the case where the use of the expansion adapter is omitted, moreover, the invention may applied to the personal computer as the small-sized electronic apparatus and the expansion apparatus as the connectable apparatus.

Figure 22:
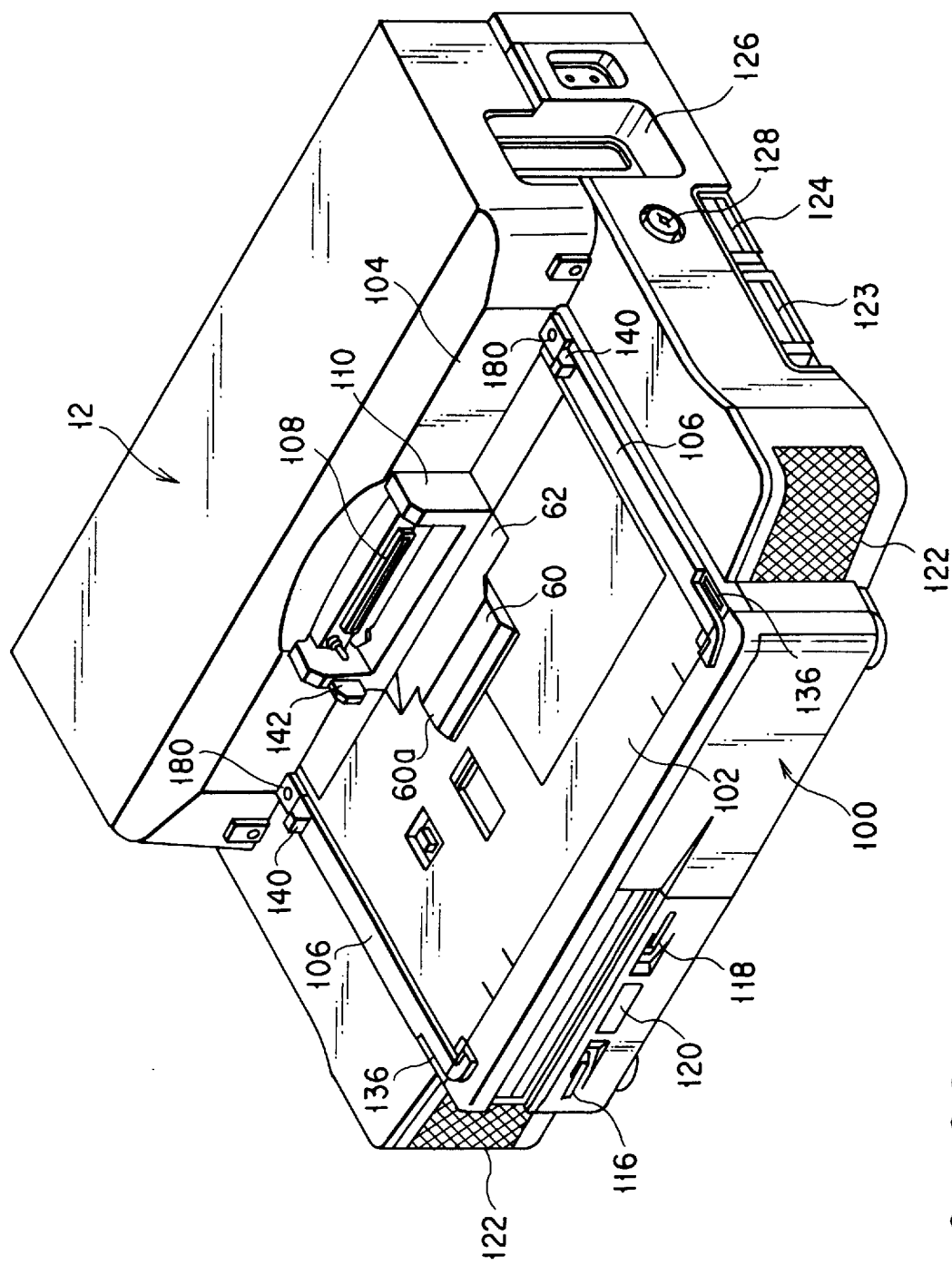
FIG. 22 is a perspective view showing an extension apparatus of an electronic processing system according to another embodiment of the invention.

FIG. 22 shows another embodiment of the present invention, in which an expansion apparatus 12 is used as the connectable apparatus. According to this embodiment, a carrying surface 102 of the expansion apparatus 12 is formed having a pushing projection 60, for use as a pushing portion, and a cover holding recess 62 that can receive a connector cover 30 of a personal computer 10. The specific arrangements of the projection 60 and the recess 62 and the other components of the expansion apparatus 12 resemble those of the foregoing embodiment. Therefore, like reference numerals are used to designate like portions throughout the drawings, and a detailed description of those portions is omitted.

The personal computer 10 to be connected to the expansion apparatus 12 is expected only to have a size fit for the apparatus 12, and its individual parts may be arranged in the same manner as those of the computer used according to the foregoing embodiment.

Also in the case of the second embodiment arranged in this manner, the connector cover of the personal computer 10 can be automatically undone as the computer is connected to the expansion apparatus 12, thus ensuring the same effect of the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An electronic processing system comprising:

an electronic apparatus having an apparatus casing including a bottom wall and a rear wall continuous with the bottom wall and formed having an aperture, a first connector located in the apparatus casing so as to face the aperture, and a connector cover provided on the rear wall of the apparatus casing to be rotatable between a closed position in which the aperture is closed and an open position in which the aperture is open; and a connectable apparatus connectable with the electronic apparatus;

the connectable apparatus including:

a carrying surface capable of detachably carrying thereon at least the rear portion of the casing of the electronic apparatus, a second connector located adjacent to the carrying surface and connectable with the first connector of the electronic apparatus placed on the carrying surface, and a pushing portion provided on the carrying surface, for abutting the connector cover to rotate the connector cover to the open position, when the apparatus casing placed on the carrying surface is moved toward the second connector.

2. An electronic processing system according to claim 1, wherein the connector cover includes a rotating shaft, extending parallel to the bottom wall of the apparatus casing and situated adjacent to the bottom wall, and a push portion situated between the shaft and the bottom wall, and the pushing portion of the connectable apparatus includes a pushing projection provided on the carrying surface so as to be able to abut the push portion of the connector cover.

3. An electronic processing system according to claim 2, wherein the connectable apparatus includes a connector setting surface, provided with the second connector and opposed to the rear wall of the apparatus casing, and guide portions provided on the carrying surface, for guiding the electronic apparatus in movement in the directions of connection and disconnection of the first and second connectors, and the pushing projection is located adjacent to the connector setting surface between the guide portions.

4. An electronic processing system according to claim 2, wherein the pushing projection has a flat top surface extending in the directions of connection and disconnection of the connectors along the carrying surface, for engaging the push portion of the connector cover to keep the connector cover undone.

5. An electronic processing system according to claim 1, wherein the connectable apparatus is provided with a cover storing recess for storing the undone connector cover.

6. An electronic processing system according to claim 1, wherein the apparatus casing is provided with a holding recess formed in the bottom wall for holding the pushing portion.

7. An electronic processing system comprising:

an electronic apparatus having an apparatus casing including a bottom wall and a rear wall continuous with the bottom wall and formed having an aperture, a first expansion connector located in the apparatus casing so as to face the aperture, and a connector cover rotatably provided on the rear wall of the apparatus casing for opening and closing the aperture;

an extension adapter including an adapter body having a carrying surface capable of detachably carrying thereon the apparatus casing of the electronic apparatus, a connector setting surface provided with a first relay connector connectable with the first expansion connector, and a rear wall provided with a second relay connector connected to the first relay connector, and a pushing portion provided on the carrying surface for abutting the connector cover to rotate the connector cover to an open position, when the apparatus casing placed on the carrying surface is moved toward the first relay connector; and an expansion apparatus connectable with the extension adapter, for expanding the capability of the electronic apparatus, the expansion apparatus including a carrying surface capable of detachably carrying thereon the adapter body and a second expansion connector located adjacent to the carrying surface and connectable with the second relay connector of the extension adapter on the carrying surface of the expansion apparatus.

8. An electronic processing system according to claim 7, wherein the connector cover includes a rotating shaft, extending parallel to the bottom wall of the apparatus casing and situated adjacent to the bottom wall, and a push portion situated between the shaft and the bottom wall, and the pushing portion of the extension adapter includes a pushing projection provided on the carrying surface of the adapter body, for abutting the push portion of the connector cover.

9. An electronic processing system comprising:

an electronic apparatus having an apparatus casing including a bottom wall and a rear wall continuous with the bottom wall and formed having an aperture, a first connector located in the apparatus casing so as to face the aperture, and a connector cover rotatably provided on the rear wall of the apparatus casing for opening and closing the aperture; and an expansion apparatus connectable with the electronic apparatus, for expanding the capability of the electronic apparatus;

the expansion apparatus including:

a carrying surface capable of detachably carrying thereon at least the rear portion of the apparatus casing of the electronic apparatus, a second connector located adjacent to the carrying surface and connectable with the first connector of the electronic apparatus placed on the carrying surface, and a pushing portion provided on the carrying surface of the expansion, for abutting the connector cover and rotating the connector cover an open position, when the apparatus casing placed on the carrying surface is moved toward the second connector.

10. An electronic processing system according to claim 9, wherein the connector cover includes a rotating shaft, extending parallel to the bottom wall of the apparatus casing and situated adjacent to the bottom wall, and a push portion situated between the shaft and the bottom wall, and the pushing portion of the expansion apparatus includes a pushing projection provided on the carrying surface for abutting the push portion of the connector cover.

11. An electronic processing system according to claim 10, wherein the expansion apparatus includes a connector setting surface, provided with the second connector and opposed to the rear wall of the apparatus casing, and guide portions provided on the carrying surface, for guiding the electronic apparatus in movement in the directions of connection and disconnection of the first and second connectors, and the pushing projection is located adjacent to the connector setting surface between the guide portions.

12. An electronic processing system according to claim 10, wherein the pushing projection has a flat top surface extending in the directions of connection and disconnection of the connectors along the carrying surface, for engaging the push portion of the connector cover to keep the connector cover undone.

13. An electronic processing system according to claim 9, wherein the expansion apparatus is provided with a cover storing recess for storing the undone connector cover.

14. An electronic processing system according to claim 9, wherein the apparatus casing is provided with a holding recess formed in the bottom wall, for holding the pushing portion.

15. An electronic processing system according to claim 9, wherein the expansion apparatus includes an apparatus casing having the carrying surface and capability expanding means located in the apparatus casing, for expanding the capability of the small-sized electronic apparatus.

* * * * *

UNITED STATES PATENT AND TRADEMARK OFFICE
CERTIFICATE OF CORRECTION

PATENT NO. : 5,841,632
DATED : November 24, 1998
INVENTOR(S) : Horii et al.

It is certified that error appears in the above-identified patent and that said Letters Patent is hereby corrected as shown below:

Claim 9, column 19, line 29, after "cover", insert --to--.

Signed and Sealed this

Eleventh Day of January, 2000

Attest:

Q. TODD DICKINSON

*Attesting Officer*   *Acting Commissioner of Patents and Trademarks*